United States Patent
Nakayama et al.

(10) Patent No.: US 7,034,346 B2
(45) Date of Patent: Apr. 25, 2006

(54) SEMICONDUCTOR DEVICE AND METHOD FOR MANUFACTURING THE SAME

(75) Inventors: Kazuya Nakayama, Kanagawa (JP); Satoshi Aida, Kanagawa (JP); Shigeo Kouzuki, Kanagawa (JP); Masaru Izumisawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 10/445,952

(22) Filed: May 28, 2003

(65) Prior Publication Data

US 2004/0007766 A1 Jan. 15, 2004

(30) Foreign Application Priority Data

| Jul. 9, 2002 | (JP) | 2002-199682 |
| Mar. 11, 2003 | (JP) | 2003-065310 |

(51) Int. Cl.
*H01L 27/148* (2006.01)

(52) U.S. Cl. ............ 257/249; 257/250; 257/332; 257/241; 257/314; 257/315

(58) Field of Classification Search ........... 257/250, 257/249, 332, 241, 314, 315; 438/262, 265, 438/522, 542, 268
See application file for complete search history.

(56) References Cited

U.S. PATENT DOCUMENTS

| 5,155,052 A | * | 10/1992 | Davies | 437/40 |
| 5,703,383 A | | 12/1997 | Nakayama | |
| 5,936,291 A | * | 8/1999 | Makita et al. | 257/405 |
| 6,040,598 A | | 3/2000 | Nakayama et al. | |
| 6,087,697 A | | 7/2000 | Patel | |
| 6,157,058 A | * | 12/2000 | Ogura | 257/315 |
| 6,232,186 B1 | * | 5/2001 | Patel | 438/268 |
| 6,259,142 B1 | * | 7/2001 | Dawson et al. | 257/365 |

FOREIGN PATENT DOCUMENTS

| JP | 7-221296 | 8/1995 |
| JP | 8-298321 | 11/1996 |
| JP | 2000-156383 | 6/2000 |
| JP | 2002-184784 | 6/2002 |

OTHER PUBLICATIONS

S. Wolf, "SiliconProcessing for the VLSI Era, vol. 2: Process Integration," Lattice Press, Sunset Beach, CA (1990), pp. 143–147,273.*

* cited by examiner

*Primary Examiner*—Steven Loke
(74) *Attorney, Agent, or Firm*—Oblon, Spivak, McClelland, Maier & Neustadt, P.C.

(57) ABSTRACT

A semiconductor device according to an embodiment of the present invention has a gate electrode which is formed on a semiconductor substrate via a gate insulating film, and which has a slit portion; side wall films formed at both side faces of the gate electrode and at side walls of the slit portion, and which fill an interior of the slit portion and cover the gate insulating film directly beneath the slit portion; and an interlayer insulating film formed to cover the gate electrode and the side wall films.

15 Claims, 29 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from the prior Japanese Patent Applications No. 2002-199682, filed on Jul. 9, 2002 and No. 2003-065310, filed on Mar. 11, 2003; the entire contents of which are incorporated herein by reference.

BACKGROUND OF THE INVENTION

1. Field of the Invention

The present invention relates to a semiconductor device and a method for manufacturing the same, and in particular, to a semiconductor device for controlling power used for a DC/DC converter, a digital audio amplifier, or the like, and to a method for manufacturing the same.

2. Related Background Art

A power MOSFET is used in applications in which it is necessary to reduce the switching loss in a high frequency band of a DC/DC converter, a digital audio amplifier, or the like as much as possible. If the switching loss is small, the amount of generated heat is small, and the electric power consumption is reduced. Therefore, for example, in portable electronics such as a notebook type personal computer and the like, the capacity of a built-in battery can be made small, and the entire apparatus can be made compact.

By the way, the shorter the switching time of the MOSFET is, i.e., the faster the switching speed is, the more the switching loss can be reduced. The switching speed depends on the gate charging amount at the time of switching, and the smaller the gate charging amount is, the faster the switching speed is. Accordingly, in order to make the switching of the MOSFET fast, it is necessary to reduce the gate capacity.

On the other hand, the channel resistance of the MOSFET is inversely proportional to the gate charging amount, and if the gate charging amount is small, ON-resistance arises. Further, if ON-resistance arises, the steady loss increases.

Further, in order to make the switching of the MOSFET fast, it is necessary to reduce the gate electrode width. If the gate electrode width is too large, because the withstand voltage of the MOSFET is reduced, from this standpoint as well, it is necessary to reduce the gate electrode width.

On the other hand, from the standpoint of high integration, making the gate electrode interval, i.e., the interval between the gate electrodes, smaller has been required. However, from the standpoint of ensuring the withstand voltage of the MOSFET, an appropriate setting in the relationship with the gate electrode width is required.

As described above, conventionally, it has been difficult to attempt to make the switching speed fast, and to realize low electric power consumption while ensuring the withstand voltage of the MOSFET and suppressing the ON-resistance because of trading off various conditions.

SUMMARY OF THE INVENTION

In accordance with a basic structure of a semiconductor device according to an embodiment of the present invention, the semiconductor device comprises: a gate electrode which is formed on a semiconductor substrate via an insulating film, and which has a slit portion; side wall films which are formed at both side faces of the gate electrode and at side walls in the slit portion, and which fill an interior of the slit portion and cover the gate insulating film directly beneath the slit portion; an interlayer insulating film formed to cover the gate electrode and the side wall films.

In accordance with a concrete structure of the semiconductor device according to an embodiment of the present invention, the semiconductor device comprises: a first conductive substrate layer structuring a drain layer; a first conductive type semiconductor layer formed on the substrate layer; second conductive type first and second base layers formed at a predetermined interval on a surface layer portion of the semiconductor layer; first conductive type first and second source layers respectively formed on surfaces of the first and second base layers; a gate insulating film formed on a substrate surface at a region extending from one side to another side of one end portions of the first and second source layers which are adjacent to one another; a gate electrode which is formed on the gate insulating film, and which has a slit portion; side wall films which are formed at both side faces of the gate electrode and at side walls in the slit portion, and which fill an interior of the slit portion and cover the gate insulating film directly beneath the slit portion; an interlayer insulating film formed to cover the gate electrode and the side wall films; a source electrode connected to the source layer and the base layer at a predetermined contact region; and a drain electrode which is formed at a rear face side of the substrate layer, and which is connected to the substrate layer.

In accordance with a method for manufacturing the semiconductor device according to an embodiment of the present invention, the semiconductor device comprises: forming a gate electrode having a slit portion by processing a gate electrode material formed on a semiconductor substrate via a gate insulating film; forming side wall films at both side faces of the gate electrode and at side walls in the slit portion by depositing an insulating film and carrying out anisotropic etching; and carrying out impurity injection for forming a source layer at a surface of the semiconductor substrate by using the gate electrode and the side wall films as a mask.

In accordance with a semiconductor device according to another embodiment of the present invention, the semiconductor device comprises: a first conductive type substrate layer; a first conductive type base layer formed on the first conductive type substrate layer; a second conductive type base layer formed at predetermined intervals at a surface layer portion of the first conductive type base layer; first conductive type source layers respectively formed at surface layer portions in vicinities of both ends of the second conductive type base layer; gate insulating films respectively formed on a substrate surface at a region extending from one side to another side of one end portions of the two second conductive type base layers formed such that one end portions thereof are adjacent to one another; gate electrodes respectively formed on the gate insulating films; insulating films respectively formed to cover the gate electrodes; a source electrode which is formed to cover a front face side of the substrate, and which is connected to the first conductive type source layer and the second conductive type base layer at a contact region between one of the gate electrodes and another of the gate electrodes; and a drain electrode which is formed at a rear face side of the first conductive type substrate layer, wherein a ratio LG/LS of a gate electrode width LG to an interval LS between the gate electrodes is less than or equal to 1, the gate electrode width LG is less than or equal to about 5 μm, and a ratio LG/xj of the gate electrode width LG to a vertical diffusion distance xj of the second conductive type base layer satisfies a relationship of an inequality $1 < LG/xj \leq 2.5$.

DETAILED DESCRIPTION OF THE EMBODIMENTS

Hereinafter, embodiments of a semiconductor device according to the present invention will be described with reference to the drawings. The structure of the semiconductor device according to the present invention can be applied to a semiconductor device having an arbitrary withstand voltage. However, from the standpoint of making switching to be fast, it is particularly effective that the structure is applied to a semiconductor device whose withstand voltage is less than or equal to 200V. Because an epitaxial substrate is usually used in a semiconductor device having this withstand voltage level, the following embodiments will be described supposing that the semiconductor device according to the present invention is manufactured by using an epitaxial substrate. However, a substrate other than an epitaxial substrate maybe used as the substrate. Further, for convenience, the following embodiments will be described supposing that a first conductive type is N type, and a second conductive type is P type.

Figure 1:
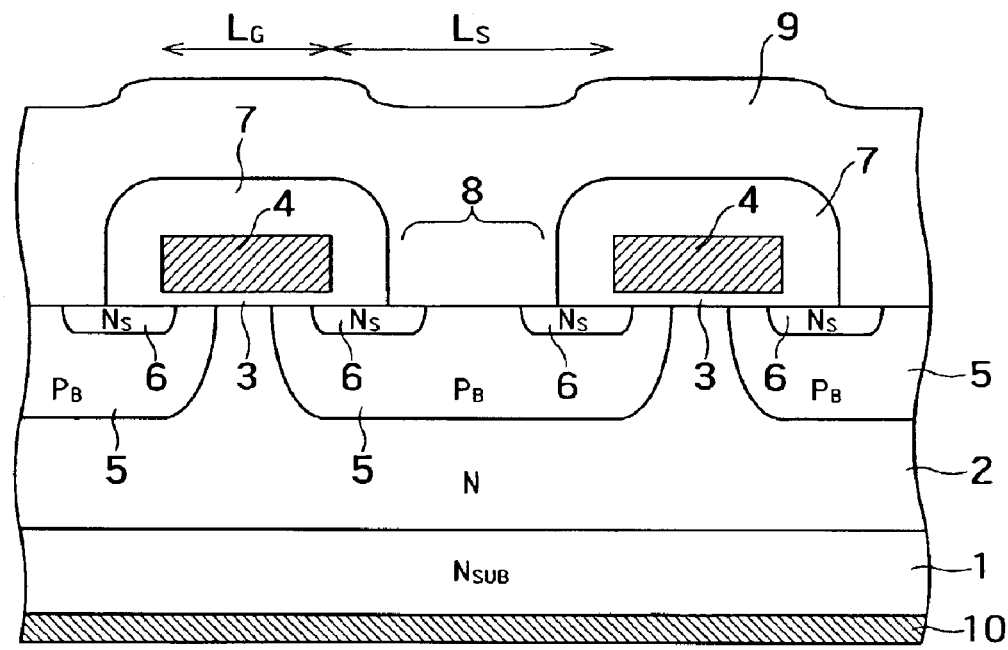
FIG. 1 is a sectional view of a semiconductor device according to a first embodiment of the present invention.

FIG. 1 is a sectional view of a semiconductor device according to a first embodiment of the present invention.

The semiconductor device according to the first embodiment of the present invention has an N type high concentration substrate layer 1, an N type base (epitaxial) layer 2 which is formed on the N type substrate layer 1 and which has a predetermined concentration, P type base layers 5 formed at predetermined intervals at a surface layer portion of the N type base layer 2, N type source layers 6 respectively formed at the surface layer portion at the vicinities of the both end of the P type base layers 5, gate insulating films 3 respectively formed on the substrate surface of the region extending from one side to the other side of the one end portions of two P type base layers 5 formed such that the one end portions thereof are close to one another, gate electrodes 4 respectively formed on the gate insulating films 3, insulating films 7 respectively formed so as to cover the gate electrodes 4, a source electrode 9 connected to the N type source layers 6 and the P type base layers 5 at a contact region 8 between one gate electrode 4 and the other gate electrode 4, and a drain electrode 10 formed so as to cover the entire rear surface of the N type substrate layer 1.

Figure 2:
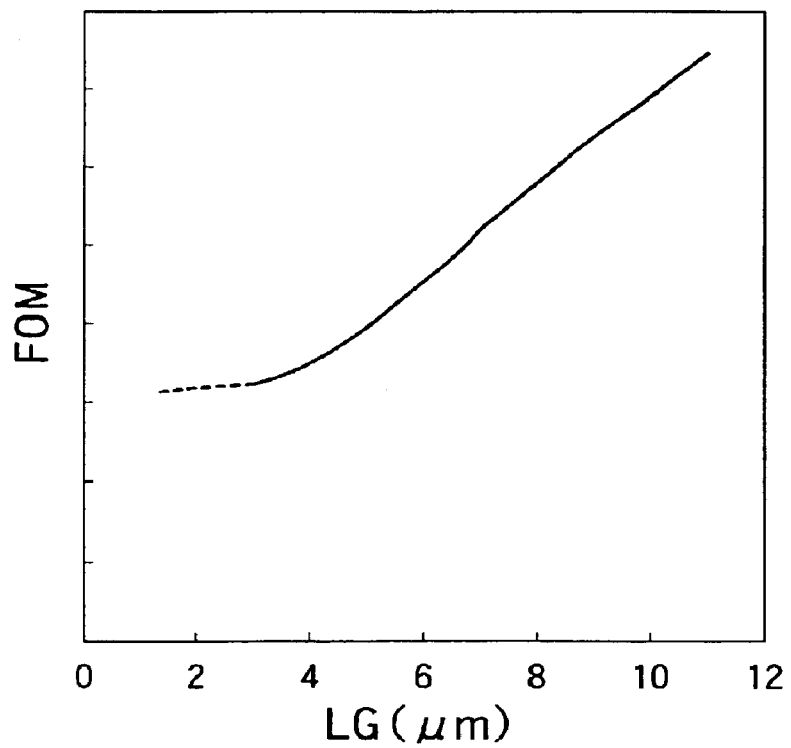
FIG. 2 is a graph showing the relationship between a gate electrode width LG and a switching speed characteristic index

FIG. 2 is a graph showing a relationship between a gate electrode width LG and a switching speed characteristic index FOM.

Looking at the graph of FIG. 2, it can be understood that there is a point of inflection at a little less than the gate electrode width LG =5 μm. Accordingly, it can be understood that setting the gate electrode width LG to less than or equal to 5 μm is effective in attempting to make the switching operations be high speed. Therefore, in the semiconductor device according to the present invention, the gate electrode width LG is to set to less than or equal to about 5 μm. Note that, when the gate electrode width LG becomes less than or equal to about 3 μm, the switching speed is hardly changed. Therefore, setting the gate electrode width LG to be equal to about 3 μm is most effective from the standpoint of making the switching operation be fast.

Figure 3:
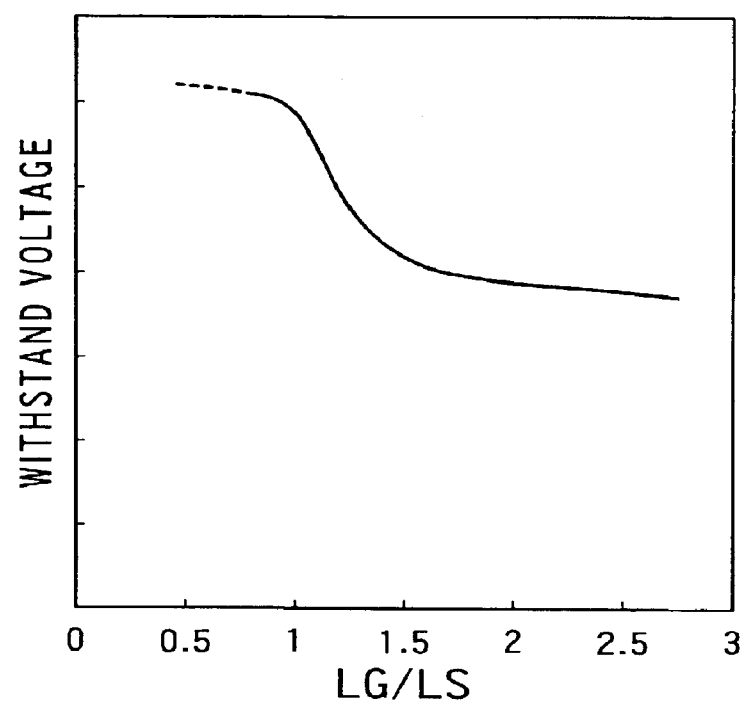
FIG. 3 is a graph showing the relationship between a withstand voltage and a ratio LG/LS of the gate electrode width LG to a gate electrode interval LS.

FIG. 3 is a graph showing a relationship between a withstand voltage and a ratio LG/LS of the gate electrode width LG to a gate electrode interval LS, i.e., an interval LS between the gate electrodes.

There are always demands for the high integration of the semiconductor devices, and the gate electrode interval LS is preferably reduced as much as possible. On the other hand, when the gate electrode width LG is reduced as described above, the withstand voltage of the element must be considered in the relationship between the gate electrode interval LS and the gate electrode width LG. However, if the value of LG/LS becomes greater than or equal to 1.5 because the gate electrode interval LS is reduced too much with respect to the gate electrode width LG, the withstand voltage of a MOSFET is reduced. It can be understood from the graph of FIG. 3 that the value of LG/LS may be about less than or equal to 1.3 in order to ensure a sufficient withstand voltage.

Therefore, in the semiconductor device according to the present invention, in order to ensure the withstand voltage, the gate electrode interval LS is set with respect to the gate electrode width LG such that the value of LG/LS becomes less than or equal to 1.3. In order to even reliably ensure the withstand voltage, the value of LG/LS may be set to be less than or equal to 1. Further, if the gate electrode interval LS is unnecessarily made large, an unnecessary region increases in the element. Accordingly, in consideration of setting the gate electrode width LG to be less than or equal to about 5 μm, the gate electrode interval LS is set to be less than or equal to about 6 μm. Particularly, if the gate electrode interval LS is set to be equal to about 4 μm, it is possible to satisfy both making the switching to be fast and the withstand voltage of the element.

Figure 4:
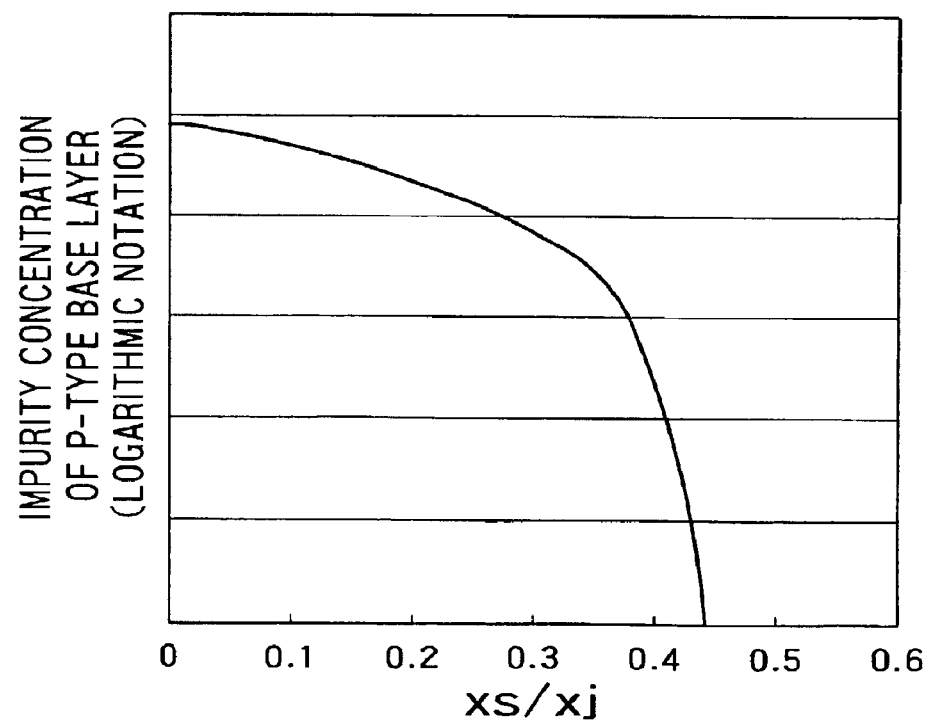
FIG. 4 is a graph in which a ratio xs/xj of a horizontal diffusion distance xs to a vertical diffusion distance xj of a P type base layer 5 is shown by the relationship with an impurity concentration of the P type base layer 5.

FIG. 4 is a graph in which a ratio xs/xj of a horizontal diffusion distance xs to a vertical diffusion distance xj is shown in a relationship with the impurity concentration of the P type base layer 5.

In a planar type MOSFET such as the semiconductor device according to the present invention, usually, a channel is formed by using lateral direction diffusion of the P type base layer 5. As is clear from the graph of FIG. 4, it can be understood that, in the impurity concentration usually set at the P type base layer 5 of the MOSFET, the ratio of the horizontal diffusion distance xs to the vertical diffusion distance xj is greater than or equal to about 0.4, i.e., about 1/2. In addition thereto, in simulations or the like, it has been understood that the ratio of the horizontal diffusion distance xs to the vertical diffusion distance xj is about 1/2. This value is used for the following formulas, and here, 1/2 is used as the most general value.

As described above, the fact that the ratio of the horizontal diffusion distance xs to the vertical diffusion distance xj becomes 1/2 means that the horizontal diffusion distance xs can be calculated by multiplying the vertical diffusion distance xj by 1/2.

By the way, in the MOSFET, if the respective one end portions of the P type base layers 5 formed such that the one end portions thereof are close to one another are accidentally connected to one another, even if a channel is opened by applying voltage to a gate electrode, electric current does not flow between the source and the drain.

In order to avoid such a situation, it is necessary for the intervals between the P type base layers 5 to be spaced so as to be greater than or equal to a distance corresponding to twice the horizontal diffusion distance xs of the P type base layer 5. The interval between the P type base layers 5 can be considered as being equal to the gate electrode width LG, and because the horizontal diffusion distance xs (PB)=(the vertical diffusion distance xj (PB))/2, it is necessary for the relationship of 2×xj (PB)/2<LG, i.e., 1<LG/xj (PB) to be satisfied.

Therefore, in the semiconductor device according to the present invention, with respect to the relationship between the vertical diffusion distance xj of the P type base layer 5 and the gate electrode width LG, the relationship of the inequality 1<LG/xj(PB) must be satisfied.

Figure 5:
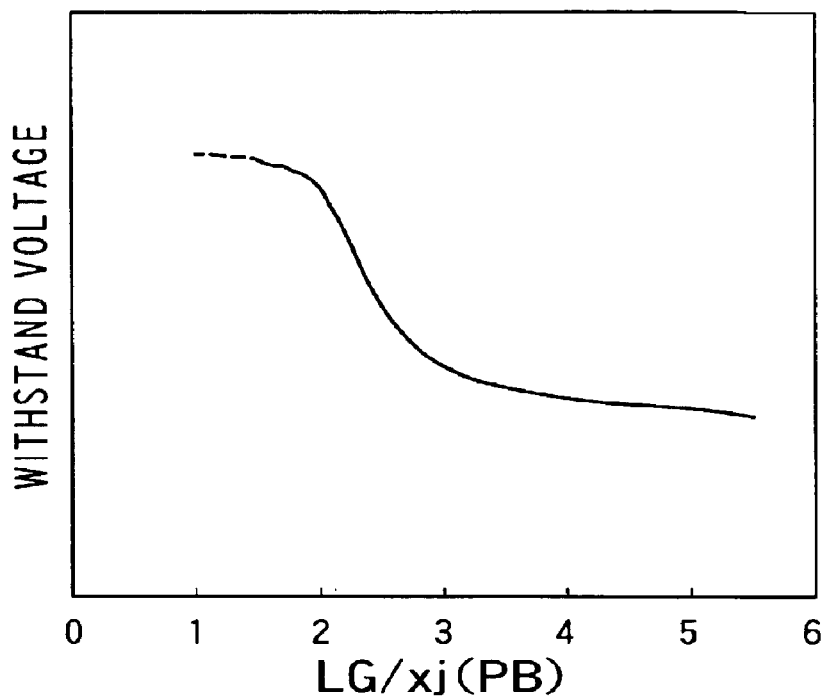
FIG. 5 is a graph showing a relationship between a withstand voltage and a ratio LG/xj (PB) of the gate electrode width LG to the vertical diffusion distance xj of the P type base layer 5.

FIG. 5 is a graph showing the relationship between the withstand voltage and the ratio LG/xj (PB) of the gate electrode width LG to the vertical diffusion distance xj of the P type base layer 5.

The relationship of the above-described inequality 1<LG/xj (PB) is of necessity satisfied when the gate electrode width LG becomes larger. However, as can be understood from the graph of FIG. 5, if the gate electrode width LG is made to be too large, a reduction of the withstand voltage is brought about. It can be understood from the graph of FIG. 5 that sufficient withstand voltage can be ensured if the value of LG/xj (PB) is less than or equal to 2.5.

Therefore, in the semiconductor device according to the present invention, with respect to the relationship between the vertical diffusion distance xj of the P type base layer 5 and the gate electrode width LG, the relationship of LG/xj (PB)<2.5 is satisfied.

Further, it can be understood from the graph of FIG. 5 that sufficient withstand voltage can be even more reliably ensured if the value of LG/xj (PB) is less than or equal to 2. Accordingly, with respect to the relationship between the vertical diffusion distance xj of the P type base layer 5 and the gate electrode width LG, it is even better that the relationship of LG/xj (PB)≦2 is satisfied.

Summarizing the above-described two inequalities, in the semiconductor device according to the present invention, with respect to the relationship between the vertical diffusion distance xj of the P type base layer 5 and the gate electrode width LG, the relationship of the inequality 1<LG/xj (PB)≦2.5 is satisfied. Further, in order to more reliably ensure sufficient withstand voltage, it is expected that the relationship of the inequality 1<LG/xj (PB)≦2 is satisfied.

Figure 6:
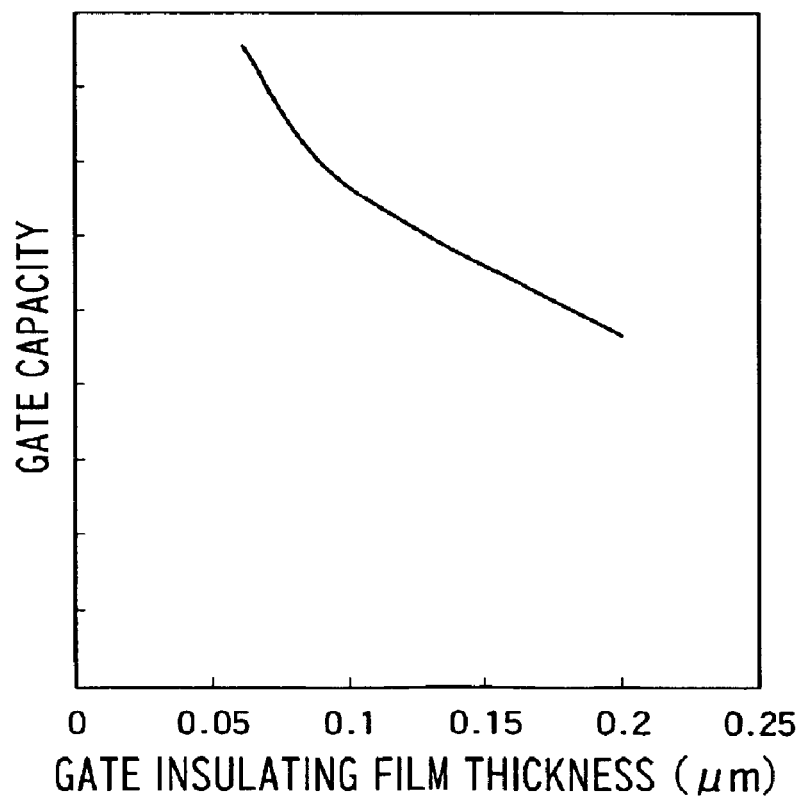
FIG. 6 is a graph showing the relationship between a gate insulating film thickness and the gate capacity.

FIG. 6 is a graph showing the relationship between a gate insulating film thickness and a gate capacity.

When an oxide film is used as the gate insulating film 3, as shown in FIG. 6, if the gate insulating film thickness becomes less than about 0.1 μm, the gate capacity increases. As a result, because a gate charging amount increases, reduction of the switching speed is brought about.

Therefore, in the semiconductor device according to the present invention, the gate insulating film thickness is greater than or equal to about 0.1 μm.

Figure 7:
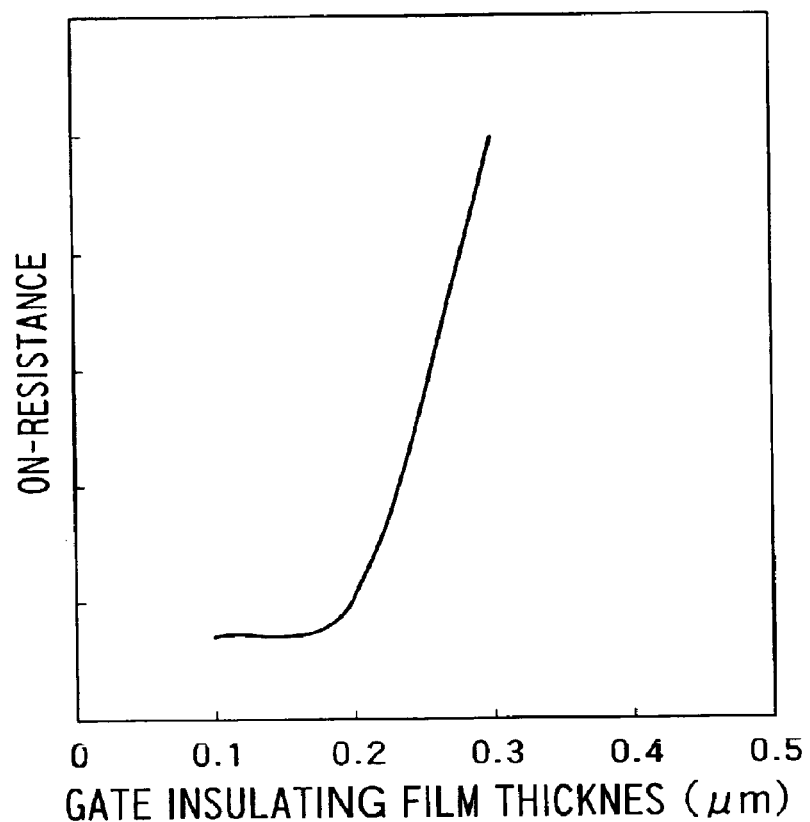
FIG. 7 is a graph showing the relationship between a gate insulating film thickness and ON-resistance.

FIG. 7 is a graph showing the relationship between the gate insulating film thickness and ON-resistance.

As described above, in the semiconductor device according to the present invention, the gate insulating film thickness is greater than or equal to about 0.1 μm. On the other hand, if the gate insulating film thickness becomes greater than about 0.2 μm, the threshold voltage of a channel becomes high, and not only an increase of the ON-resistance is brought about, but also, in the worst case, the device comes to not operate.

Therefore, in the semiconductor device according to the present invention, in consideration of the gate capacity and the ON-resistance, the gate insulating film thickness is made to be greater than or equal to about 0.1 μm, and to be less than or equal to about 0.2 μm.

Note that values shown in FIG. 6 and FIG. 7 are values in a case in which the gate insulating film is formed from an oxide film. Accordingly, when a different material is used, the film thickness is set in consideration of the gate capacity and the ON-resistance in the same way.

In the MOSFET, in addition to the above-described respective conditions, there are cases in which a resistance component which the gate electrode has may be problem. If the size of the semiconductor device is large when the resistance component is larger by a given extent or more, the transmission of gate signals in the gate electrode requires much time. As a result, the switching speed is reduced, or in the worst case, breakage arises.

In order to avoid such a situation, it is necessary to make the gate electrode be low-resistance. Polysilicon is often used as the material of the gate electrode. As one method for making the polysilicon gate electrode to be low-resistance, there is a method in which a polysilicon film for the gate electrode is formed so as to be thicker than that in a normal case, and impurity doping of a concentration higher than a normal polysilicon gate electrode is carried out. Polysilicon film for the gate electrode is usually made such that the thickness thereof is about 0.5 μm. However, when a process for making the gate electrode be low-resistance is carried out, the film thickness is made to be thicker than that in the normal case, and doping of a large amount of impurities is carried out on the polysilicon by using a phosphorus getter process or the like. Therefore, the gate electrode can be made to be low-resistance without increasing the number of unnecessary processes.

As another method for making the gate electrode to be low-resistance, there is a method in which the gate electrode is made to be a silicon metal compound by using metals such as titanium (Ti), tungsten (W), molybdenum (Mo), and the like. Because the resistance of the silicon metal compound is smaller than the doped polysilicon by about one digit, not only the gate electrode can be easily made to be low-resistance, but also the thickness of the polysilicon film itself for the gate electrode can be made thin. In this case, because the resistance of the silicon metal compound is sufficiently low, it is effective even to form only the silicon metal compound on the surface of the gate polysilicon.

Figure 8:
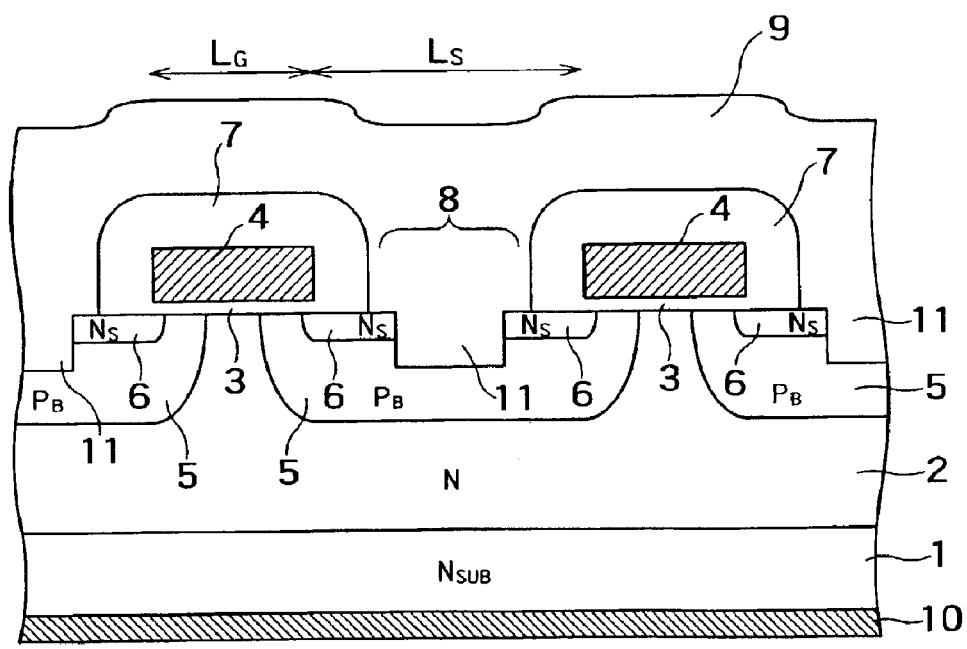
FIG. 8 is a sectional view of a semiconductor device according to a second embodiment of the present invention.

FIG. 8 is a sectional view of a semiconductor device according to a second embodiment of the present invention.

In the semiconductor device according to the first embodiment of the present invention which was described above, the source electrode 9 is in contact with the substrate with a flat face at the contact region 8. However, in the semiconductor device according to the second embodiment of the present invention, the source electrode 9 is in contact with a trench formed at the portions including the N type source layer 6 and the P type base layer 5 at the contact region 8.

Because the source electrode 9 can reliably contact the N type source layer 6 and the P type base layer 5 by using such a structure, it is possible to design the gate electrode interval LS so as to be smaller while ensuring the process margin, and it is effective also from the standpoint of improving the integration of the element.

Further, because the N type source layer 6 and the P type base layer 5 are reliably short-circuited and the contacting position between the source electrode 9 and the P type base layer 5 is positioned lower than the N type source layer 6, it can be thought that the breaking resistance at the time of switching is improved.

In the cutting-off of the current when the MOSFET is turned off, hole electric current passes through from the drain electrode 10 side to the source electrode 9 side. Because the electric potential at the contacting position is 0, in the case of a normal structure in which the substrate surface of the contact region 8 is flat, when the hole electric current comes out, the hole electric current passes through the P type base layer 5 directly beneath the N type source layer 6, and comes out to the source electrode 9 side. Accordingly, an electron injection occurs due to the hole electric current, and the MOSFET is set in the same state as the on state even though the MOSFET is off, and in some cases, breakage of the element is brought about.

On the other hand, when the trench is formed at the contact region 8 as in the semiconductor device according to the second embodiment of the present invention, because the contacting position between the source electrode 9 and the P type base layer 5 is positioned lower than the N type source layer 6, the hole electric current does not pass through the P type base layer 5 directly beneath the N type source layer 6, and comes out from the drain electrode 10 side to the source electrode 9 side. Accordingly, the parasitic pnp transistor does not operate by the hole electric current, and a situation in which breakage of the element is brought about can be prevented in advance.

Figure 9:
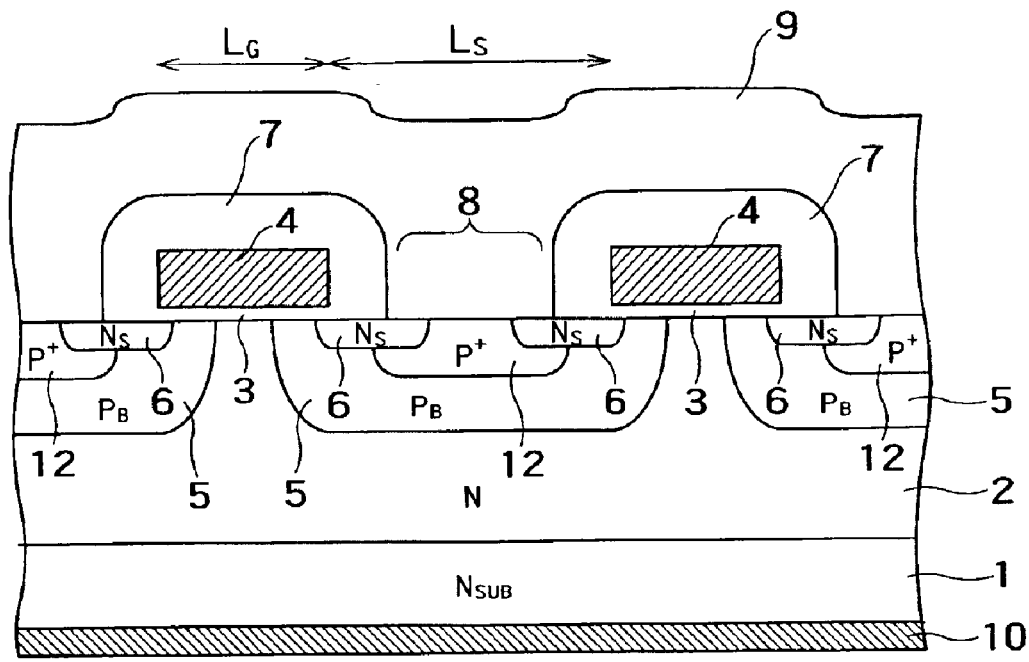
FIG. 9 is a sectional view of a semiconductor device according to a third embodiment of the present invention.

FIG. 9 is a sectional view of a semiconductor device according to a third embodiment of the present invention.

The semiconductor device according to the third embodiment of the present invention is different from the semiconductor device according to the first embodiment of the present invention in that there is provided a P type high concentration layer 12 which is further formed on the surface layer portion at the central portion of the P type base layer 5 at the contact region 8, and which has an impurity concentration higher than that of the P type base layer 5.

Because the N type source layer 6 and the P type base layer 5 can be more reliably made to contact one another via the P type high concentration layer 12 by using such a structure, in particular, it is possible to reduce the voltage drop due to hole electric current flowing at the P type base layer 5 directly beneath the N type source layer 6 when the MOSFET is turned off. As a result, breakage of the element due to electric current being flowing into the N type base layer 2 by forward biasing the N type source layer 6 can be prevented in advance.

Figure 10:
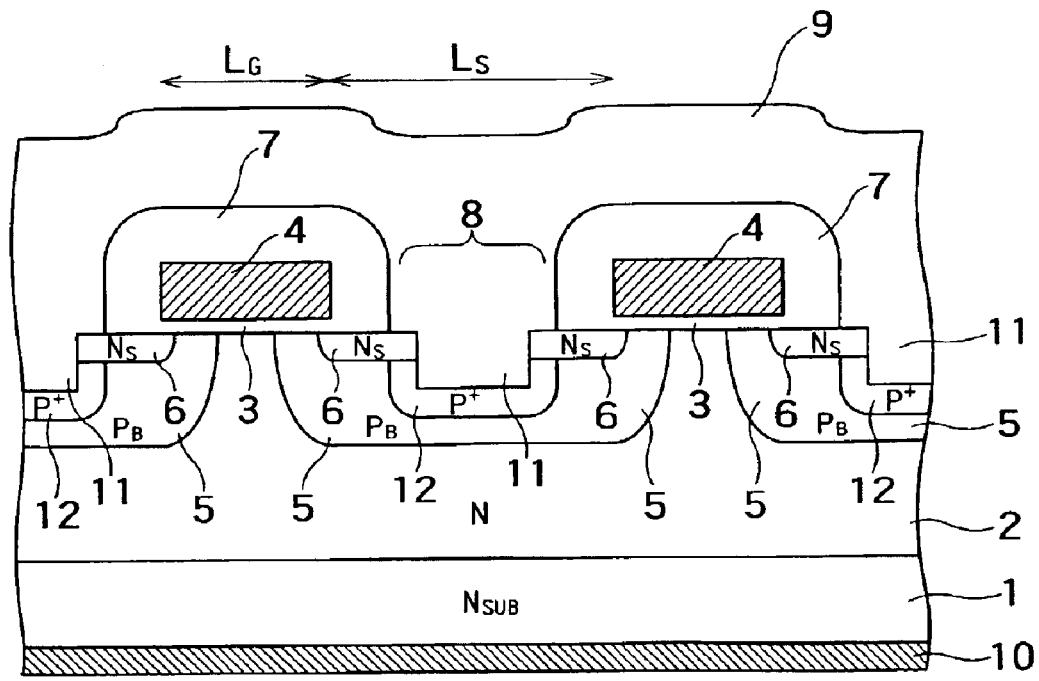
FIG. 10 is a sectional view of a semiconductor device according to a fourth embodiment of the present invention.

FIG. 10 is a sectional view of a semiconductor device according to a fourth embodiment of the present invention.

In the semiconductor device according to the fourth embodiment of the present invention, the structures of the semiconductor devices according to the second and third embodiments of the present invention are combined. The P type high concentration layer 12 formed at the surface layer portion at the central portion of the P type base layer 5 at the contact region 8 is provided, and the source electrode 9 is in contact with the trench formed at the portion including the N type source layer 6 and the P type base layer 5 at the contact region 8.

Breakage of the element can be more reliably prevented by using such a structure.

Figure 11:
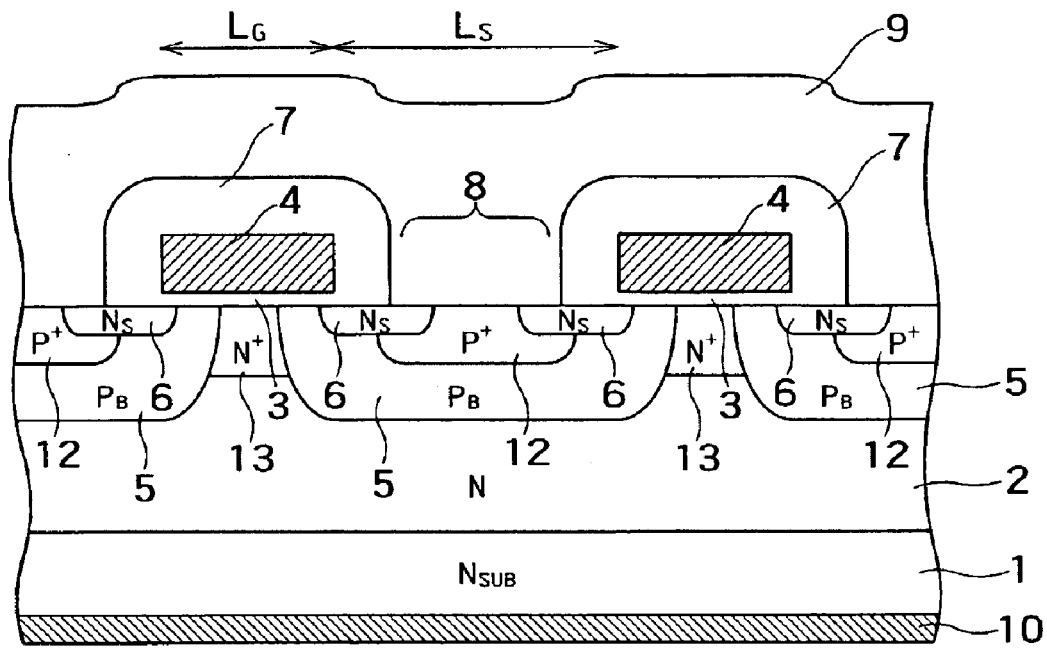
FIG. 11 is a sectional view of a semiconductor device according to a fifth embodiment of the present invention.

FIG. 11 is a sectional view of a semiconductor device according to a fifth embodiment of the present invention.

The semiconductor device according to the fifth embodiment of the present invention is different from the semiconductor device according to the third embodiment of the present invention in that there is further provided an N type high concentration layer 13 which is formed on the surface layer portion of the N type base layer 2 directly beneath the gate electrode 4, and which has an impurity concentration higher than that of the N type base layer 2. Namely, the semiconductor device according to the fifth embodiment of the present invention is different from the semiconductor device according to the first embodiment of the present invention in that there are provided the P type high concentration layer 12 formed at the surface layer portion of the central portion of the P type base layer 5 at the contact region 8, and the above-described N type high concentration layer 13.

In this way, by providing the N type high concentration layer 13, a junction FET resistance component which was between the P type base layer 5 and the N type base layer 2 can be suppressed so as to be low, and the ON-resistance can be reduced. In order to effectively reduce the ON-resistance, the depth of the N type high concentration layer 13 may be made deeper than ½ of the depth of the P type base layer 5.

Because the length of a channel formed by the P type base layer 5 is further shortened by providing the N type high concentration layer 13, the input capacity of the gate is made small, and it is possible to attempt to make switching to be fast. Note that if the length of the channel becomes short, the gate electrode width LG can be reduced, and in the embodiment, the gate electrode interval LS may be made to be about 3 µm.

Figure 12:
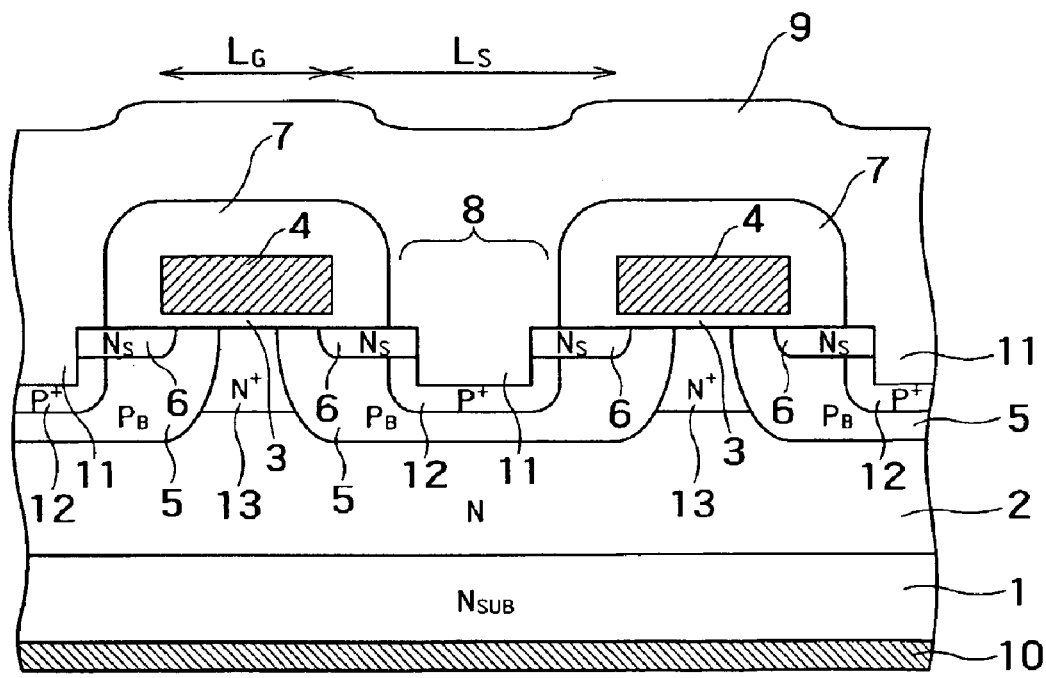
FIG. 12 is a sectional view of a semiconductor device according to a sixth embodiment of the present invention.

FIG. 12 is a sectional view of a semiconductor device according to a sixth embodiment of the present invention.

As compared with the semiconductor device according to the fourth embodiment of the present invention, the semiconductor device according to the sixth embodiment of the present invention further has the N type high concentration layer 13 formed at the surface layer portion of the N type base layer 2 directly beneath the gate electrode 4. Namely, the semiconductor device according to the sixth embodiment of the present invention is different from the semiconductor device according to the first embodiment of the present invention in that the semiconductor device according to the sixth embodiment of the present invention has the P type high concentration layer 12 formed at the surface layer portion of the central portion of the P type base layer 5 at the contact region 8, and the source electrode 9 is in contact with the trench formed at the portion including the N type source layer 6 and the P type base layer 5 at the contact region 8, and the semiconductor device further has the above-described N type high concentration layer 13.

By using such a structure, the degree of integration of the element can be improved while ensuring the process margin, and the breaking resistance of the element can be improved, and it is possible to attempt to make the switching fast by reducing the ON-resistance.

Figure 13:
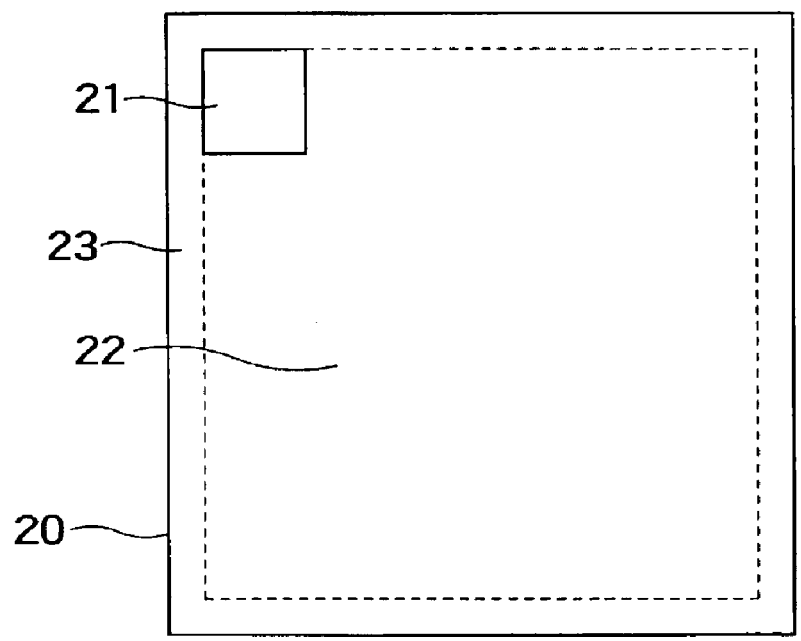
FIG. 13 is a plan view of the entire semiconductor device.

FIG. 13 is a plan view of the entire semiconductor device.

A semiconductor device (die) 20 is broadly divided into three regions which are an element region 22 occupying the major part of the entire device, a junction trailing end region 23 provided at the outer peripheral portion of the element region 22, and a gate pad region 21 provided at one of the corner portions of the element region 22.

The semiconductor devices according to the respective embodiments of the present invention are formed at the element region 22. The gate pad region 21 is a region for pulling the gate wiring out from the semiconductor device by wire bonding or the like.

Figure 14:
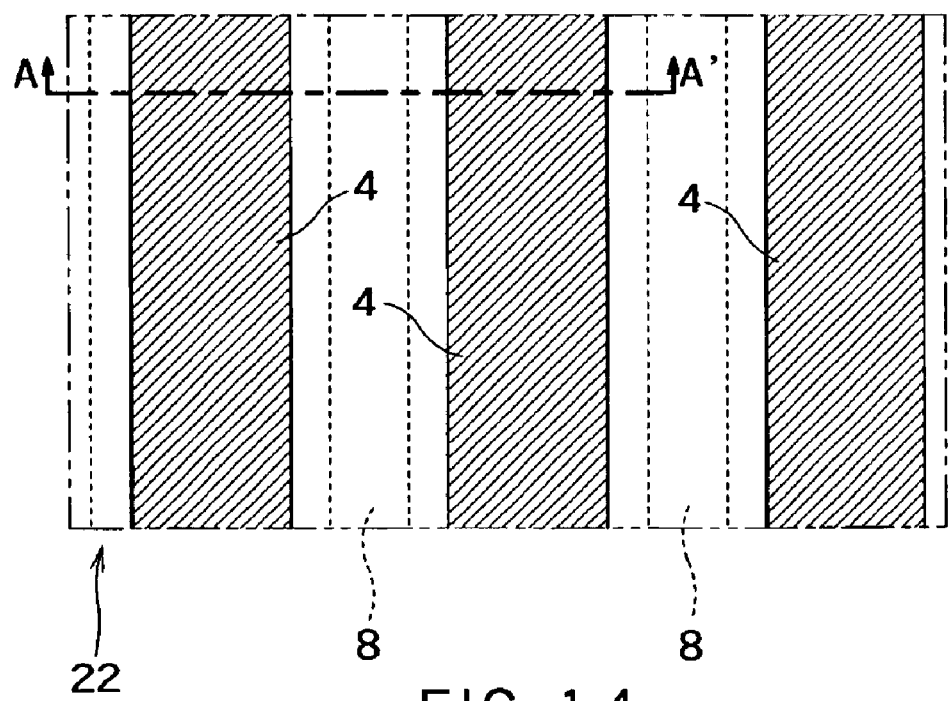
FIG. 14 is an enlarged plan view of an element region at which an element is formed in a strip shape.
Figure 15:
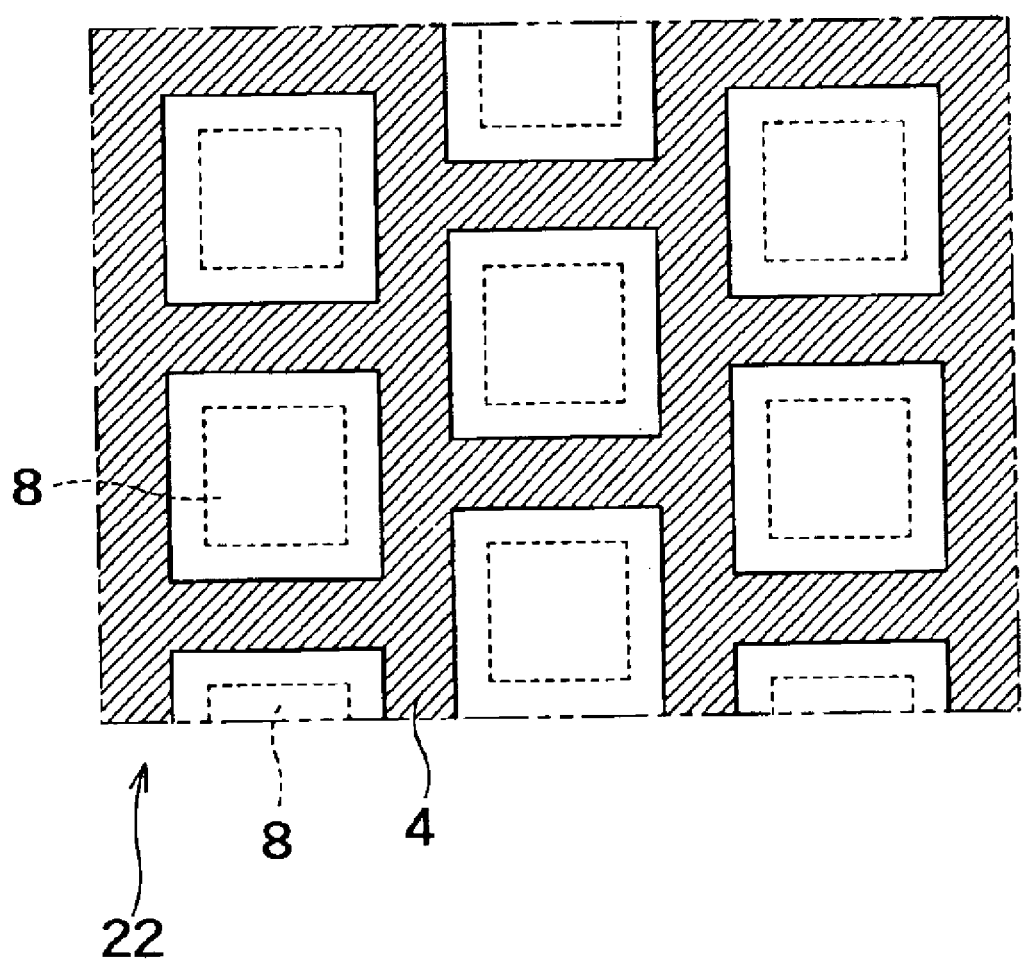
FIG. 15 is an enlarged plan view of an element region at which an element is formed in a mesh shape.

FIG. 14 is an enlarged plan view of the element region in which the element is formed in a stripe shape. FIG. 15 is an enlarged plan view of the element region in which the element is formed in a mesh shape. When the semiconductor devices according to the respective embodiments of the present invention are formed at the element region 22, the semiconductor devices may be formed in the form of a stripe shape as shown in FIG. 14, or may be formed in the form of a mesh shape as shown in FIG. 15. In FIG. 14 and FIG. 15, only the gate electrodes 4 and the contact regions 8 are shown. Note that a sectional view taken along the cutting line AA' of FIG. 14 is the sectional view of the semiconductor devices according to the respective embodiments of the present invention shown in FIG. 1, and FIGS. 8 to 12.

In the above-described respective embodiments, configurations were described in which, by stipulating the conditions such as the interval LS between the gate electrodes, the gate electrode width LG, the ratio LG/LS of the gate electrode width LG to the interval between the gate electrodes LS, the ratio LG/xj of the gate electrode width LG to the vertical diffusion distance xj of the base layer, and the like, it is possible to attempt to make switching fast and to realize low electric power consumption by reducing the gate capacity, while ensuring the withstand voltage of the MOSFET and suppressing ON-resistance.

In the respective embodiments which will be described hereinafter, structures which obtain the same effects by changing the shape of the gate electrode and the structure of the periphery thereof will be described.

Figure 16:
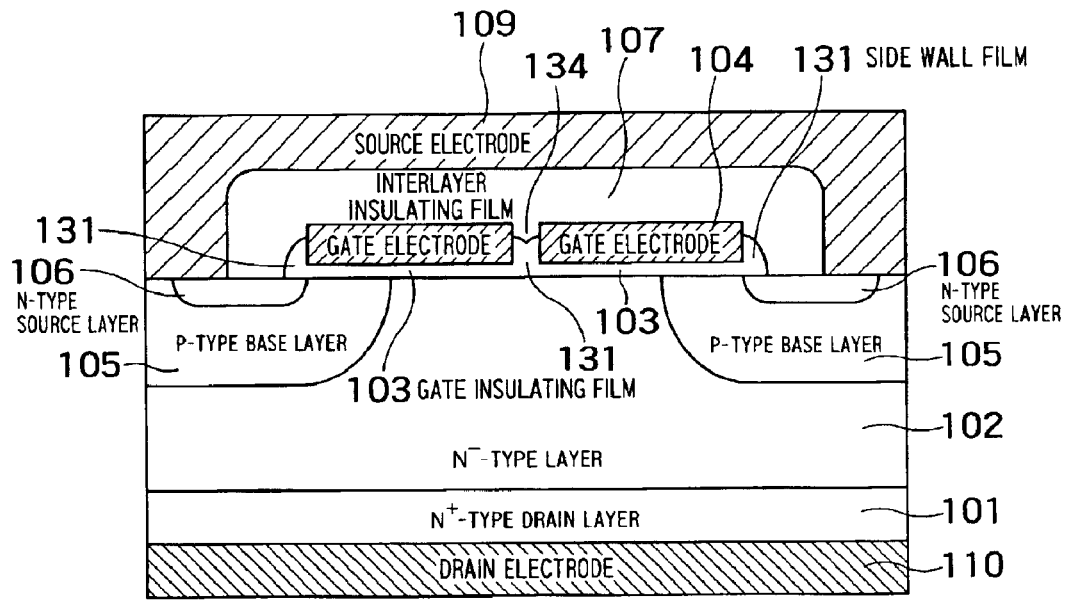
FIG. 16 is a sectional view of a semiconductor device according to a seventh embodiment of the present invention.

FIG. 16 is a sectional view of a semiconductor device according to a seventh embodiment of the present invention.

The semiconductor device according to the seventh embodiment of the present invention has an N type high concentration substrate layer 101 structuring an N type high concentration drain layer, an N type semiconductor (epitaxial) layer 102 which is formed on the N type substrate layer 101 and which has a predetermined concentration, P type base layers 105 formed at predetermined intervals at the surface layer portion of the N type semiconductor layer 102, N type source layers 106 respectively formed at the surface layer portion at the vicinities of the end portions of the P type base layer 105, a gate insulating film 103 formed on the substrate surface of the region extending from one side to the other side of the one end portions of the two P type base layers 5 formed such that the one end portions thereof are close to one another, a gate electrode 104 which is formed on the gate insulating film 103 and which has a slit portion 134 at the central portion, side wall films 131 which are formed at the both side faces of the gate electrode 104 and the side walls in the slit portion 134 and which fill in the slit portion 134 and cover the gate insulating film 103 directly beneath the slit portion 134, an interlayer insulating film 107 formed to cover the gate electrode 104, the source electrode 109 which is formed to cover the substrate surface side and which is connected to the N type source layers 106 and the P type base layers 105 at a predetermined contact region, and a drain electrode 110 which is formed to cover the rear face side of the N type substrate layer 101 and which is connected to the N type substrate layer 101.

Figure 17:
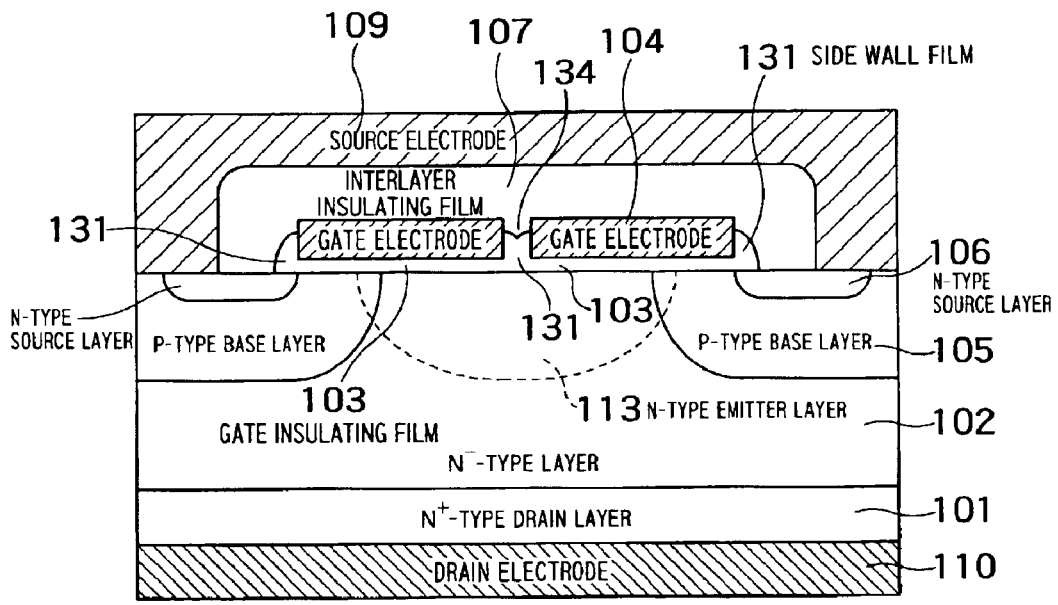
FIG. 17 is a sectional view of a semiconductor device according to an eighth embodiment of the present invention.

FIG. 17 is a sectional view of a semiconductor device according to an eighth embodiment of the present invention.

As compared with the semiconductor device according to the seventh embodiment of the present invention shown in FIG. 16, the semiconductor device according to the eighth embodiment of the present invention further has an N type emitter layer (high concentration layer) 113 which is formed at the surface layer portion of the N type semiconductor layer 102 directly beneath the slit portion 134 of the gate electrode 104, and which has an impurity concentration which is higher than that of the N type semiconductor layer 102 and lower than that of the P type base layer 105.

In the semiconductor devices according to the seventh and eighth embodiments of the present invention, a portion where the gate electrode 104 does not exist is formed at the space where the gate electrode 104 originally existed by providing the slit portion 134 at the central portion of the gate electrodes 104. In accordance therewith, the gate capacity is reduced by an amount corresponding to the volume of the slit portion 134, and it is possible to attempt to make the switching speed of the semiconductor device to be fast.

Note that the slit portion 134 of the gate electrode 104 may be made to be, for example, a stripe-shaped slit, or a slit formed from a plurality of opening portions.

In a planar type MOSFET, there are cases in which a current path structured from the N type semiconductor layer 102 at the portion sandwiched by the two P type base layers 105 is made to be tapered due to dispersion in the manufacturing process or the like, and deterioration of ability of the current to flow through is brought about.

However, if the N type emitter layer 113 is formed at the surface layer portion of the N type semiconductor layer 102 directly beneath the slit portion 134 of the gate electrode 104 as in the semiconductor device according to the eighth embodiment of the present invention, it is possible to prevent the current path from becoming tapered, and to attempt to improve the ability of the current to flow through of that portion.

The N type emitter layer 113 can be formed in advance before forming the gate electrode 104. However, for example, if impurity injection is carried out by using the gate electrode 104 itself at which the above-described slit portion 134 is formed as a mask, so-called matching offset can be avoided, and the N type emitter layer 113 can be formed at a sufficient positional accuracy.

Moreover, if the N type emitter layer 113 is formed such that the end portions of both of the N type emitter layer 113 and the P type base layer 105 are over lapped due to the gate electrode 104 being formed to be minute or the like, the length of the channel formed at the surface layer portion of the P type base layer 105 can be shortened, and not only the ability of the current to flow through is further improved, but also, the input capacity of the gate is reduced. Therefore, it is possible to operate the semiconductor device faster.

Figure 18:
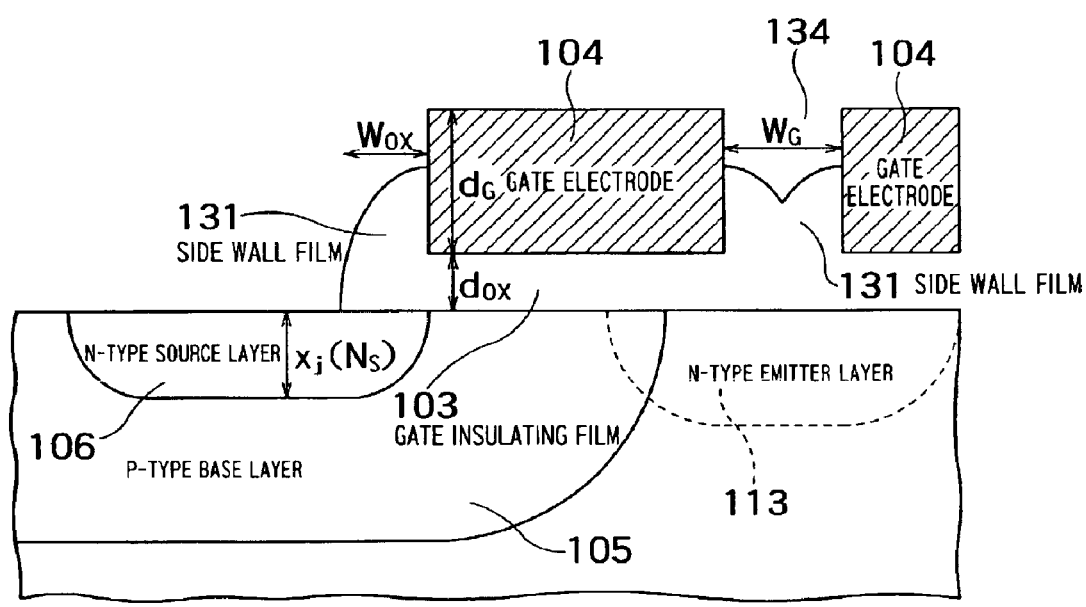
FIG. 18 is a sectional view in which a structure of a gate electrode, a slit portion of the gate electrode, and the periphery thereof in the semiconductor device according to an eighth embodiment of the present invention is displayed in an enlarged manner.

FIG. 18 is a sectional view in which the structure of the gate electrode, the slit portion thereof, and the periphery thereof in the semiconductor device according to the eighth embodiment of the present invention shown in FIG. 17 are shown in an enlarged manner.

The gate electrode 104 having the slit portion 134 is formed by depositing a gate electrode material such as polysilicon or the like on the gate insulating film 103 and carrying out patterning. The slit portion 134 can be formed at a sufficient positional accuracy by carrying out patterning on the slit portion 134 at the same time as the patterning on the peripheral portion of the gate electrode 104.

Note that the method for forming the gate electrode 104 having the slit portion 134 is the same as in the above-described seventh embodiment, and as in other embodiments which will be described later as well. A more detailed method for manufacturing the semiconductor device according to the present invention will be described later.

Only the gate insulating film 103 exists on the substrate in the slit portion 134 immediately after the gate electrode 104 having the slit portion 134 is formed. Therefore, by covering the portion other than the slit portion 134 with a resist and carrying out impurity injection, the N type emitter layer 113 can be formed directly beneath the slit portion 134 as in the semiconductor device according to the eighth embodiment of the present invention. Further, when the N type source layer 106 is formed, impurity injection may be carried out while the slit portion 134 is covered by the resist.

By the way, when polysilicon is used as the gate electrode material, usually, polysilicon into which the impurity has not yet been injected is used in order to obtain a satisfactory processing accuracy. Further, the injection of the impurity into the polysilicon is carried out by the impurity injection carried out when the N type source layer 106 is formed. However, if the slit portion 134 is covered with the resist, the vicinity portion of the slit portion 134 of the gate electrode 104 is covered. As a result, the problem that the injection of the impurity into the vicinity portion of the slit portion 134 is prevented arises.

Here, in order to avoid such a problem, in the semiconductor device according to the present invention, the slit portion 134 of the gate electrode 104 is covered with the side wall film 131 formed at the side walls in the slit portion 134. Note that the side wall film 131 is formed by depositing an insulating film such as an oxide film or a nitride film, or the like, and etching. If the side wall film 131 is formed in the slit portion 134 and an appropriate accelerating voltage for impurity injection is set, the impurity injection into the polysilicon which is the gate electrode material is carried out in an appropriate range by the impurity injection for forming the N type source layer 106 while avoiding impurity injection into the surface layer portion of the N type semiconductor layer 102 directly beneath the slit portion 134 without using the resist.

Here, in order for the side wall film 131 to reliably cover the slit portion 134, a width WG of the slit portion 134 may be less than or equal to twice a width W0X of the side wall film. Accordingly, the relationship of the inequality WG≦2W0X is established between the width WG of the slit portion 134 and the width W0X of the side wall film.

On the other hand, because the side wall film 131 is formed by depositing an insulating film and etching, the side wall film 131 is formed not only in the slit portion 134, but also at the both side faces of the gate electrodes 104 symmetrically. Further, the side wall film 131 formed at the both side faces of the gate electrodes 104 interrupts the impurity injection for forming the N type source layer 106 at the vicinities of the both side faces of the gate electrodes 104. Accordingly, if the width W0X of the side wall film 131 is too broad, there is the possibility that the N type source layer 106 cannot be formed up to the place directly beneath the end portion of the gate electrode 104 in accordance with the original design.

Therefore, in consideration of the impurity concentration which is usually set at the N type source layer 106, and the positional relationship between the end portion of the gate electrode 104 and the end portion of the N type source layer 106 in the normal design, it is necessary for the relationship of the inequality W0X≦xj (NS) to be established between the width W0X of the side wall film 131 and the vertical diffusion distance xj (NS) of the N type source layer 106.

Among the described-above inequalities, it is necessary for at least the inequality WG ≦2W0X stipulating the relationship between the width WG of the slit portion 134 and the width W0X of the side wall film to be established.

Further, in consideration of the positional relationship between the end portion of the gate electrode 104 and the end portion of the N type source layer 106 in the normal design, it is necessary for the inequality W0X≦xj (NS) stipulating the relationship between the width W0X of the side wall film 131 and the vertical diffusion distance xj (NS) of the N type source layer 106 to also be established. Accordingly, in this case, because it is necessary for the two inequalities to be established simultaneously, this leads to the conclusion that it is necessary for the inequality WG≦2xj (NS) to be established between the width WG of the slit portion 134 and the vertical diffusion distance xj (NS) of the N type source layer 106.

When the side wall film 131 is formed and the impurity injection for forming the N type source layer 106 is carried out by using the side wall film 131 as a mask, as described above, it is necessary to consider suppressing for the width W0X of the side wall film 131 so that the N type source layer 106 is formed to be diffused in the horizontal direction up to a predetermined position, namely, so that horizontal diffusion of the N type source layer 106 is not suppressed too much.

However, on the other hand, if the impurity injection for forming the N type source layer 106 is carried out by using the side wall film 131 as a mask, there is the advantage obtained by suppressing the horizontal diffusion of the N type source layer 106 as compared with the case in which only the gate electrode 104 is used as a mask. Particularly, if the P type base layer 105 is formed to be a shallow shape as miniaturization of the element progresses, in the impurity injection by self-alignment which uses only the gate electrode 104 as a mask, there is the concern that the channel will disappear due to excessive horizontal diffusion of the N type source layer 106. Further, even if the channel does not disappear, there is the concern that the threshold voltage will fluctuate or the withstand voltage will fall due to punch-through. Therefore, if the impurity injection by using the side wall film as a mask is carried out, it is possible to diffusion-form the N type source layer 106 at an appropriate region while avoiding such problems.

Figure 19:
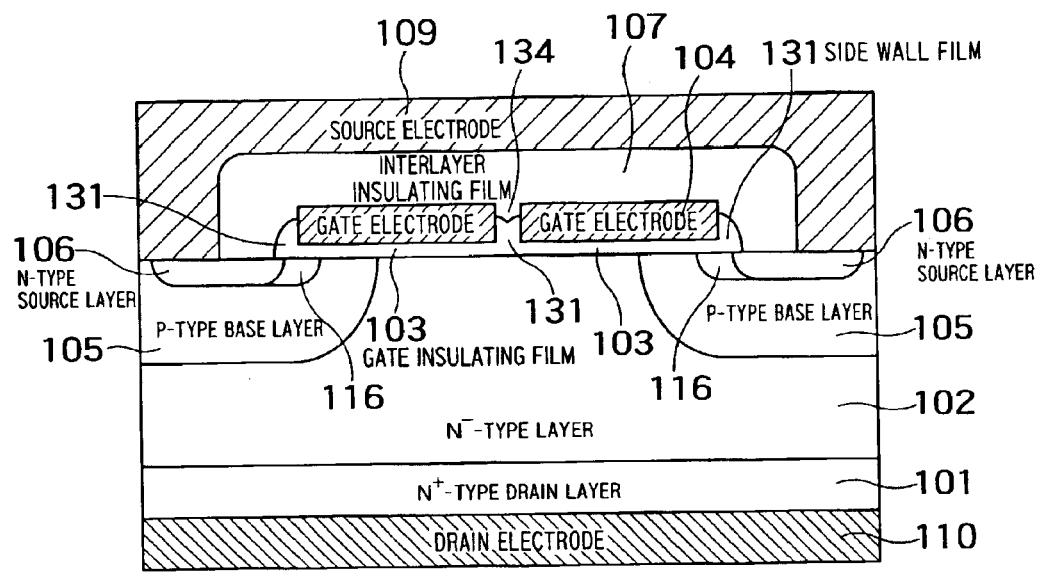
FIG. 19 is a sectional view of a semiconductor device according to a ninth embodiment of the present invention.

FIG. 19 is a sectional view of a semiconductor device according to a ninth embodiment of the present invention.

As compared with the semiconductor device according to the seventh embodiment of the present invention shown in FIG. 16, the semiconductor device according to the ninth embodiment of the present invention further has an N type LDD layer 116 which is formed at the surface layer portion of the P type base layer 106 directly beneath the both end portions of the gate electrode 104 and to be adjacent to the N type source layer 106, and which has an impurity concentration lower than that of the N type source layer 106.

In the semiconductor device according to the ninth embodiment of the present invention, before the formation of the side wall film 131 and the impurity injection for forming the N type source layer 106, using the electrode 104 as a self-alignment mask, injection of an impurity whose concentration is lower than that at the N type source layer 106 is carried out, and the N type LDD layer 116 is formed in advance. Thereafter, the side wall film 131 is formed, and the N type source layer 106 is formed by carrying out impurity injection by using the side wall film 131 as a mask.

By the N type LDD layer 116 having an impurity concentration lower than that of the N type source layer 106 formed in advance, excessive horizontal diffusion of the N type source layer 106 can be suppressed, and a stable channel can be formed at the region directly beneath the gate electrode 104. Further, due to the existence of the N type LDD layer 116, the N type source layer 106 and the inversion layer of the channel are reliably connected to one another, and improvement of the ability of the current to flow through can be attempted.

Note that the N type LDD layer 116 may be formed at the semiconductor device according to the eighth embodiment of the present invention shown in FIG. 17.

Figure 20:
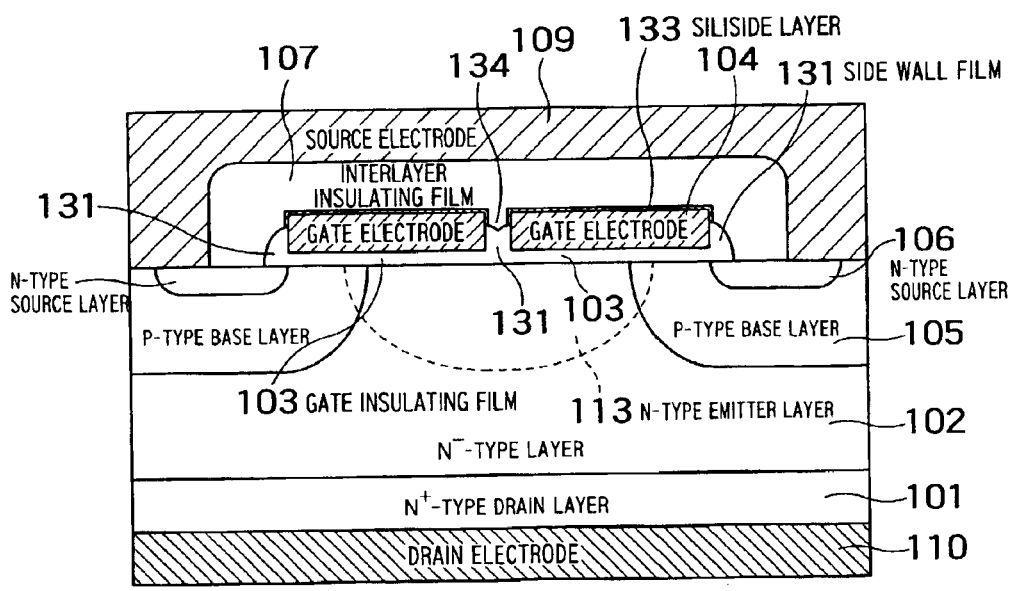
FIG. 20 is a sectional view of a semiconductor device according to a tenth embodiment of the present invention.

FIG. 20 is a sectional view of a semiconductor device according to a tenth embodiment of the present invention.

As compared with the semiconductor device according to the eighth embodiment of the present invention shown in FIG. 17, the semiconductor device according to the tenth embodiment of the present invention further has silicide layers 133 which are formed on the gate electrodes 104.

When the silicide layer 133 is formed on the gate electrode 104, as compared with the case in which the gate electrode 104 formed from only polysilicon into which the impurity was injected is used, the gate resistance of the element is reduced by about one digit, and the delay of the gate electric potential in the element at the time of operation is reduced. In accordance therewith, operation of the element becomes fast and uniform, and improvement of resistance to breakage at the time of switching can be attempted.

Note that, because the side wall film 131 is formed in the semiconductor device according to the tenth embodiment of the present invention as well, the creeping distance between the gate electrode 104 and the N type source layer 106 is made to be larger than usual. As a result, when the silicide layer 133 is formed, the silicide layer 133 can be formed by self-alignment. Accordingly, an exposure process or the like is unnecessary in order to form the silicide layer 133, and increase of the number of the processes is not brought about.

Further, the silicide layer 133 may be formed at the semiconductor devices according to the respective embodiments of the present invention which will be described later, in addition to the semiconductor devices according to the seventh and the ninth embodiments of the present invention shown in FIG. 16 and FIG. 19.

Figure 21:
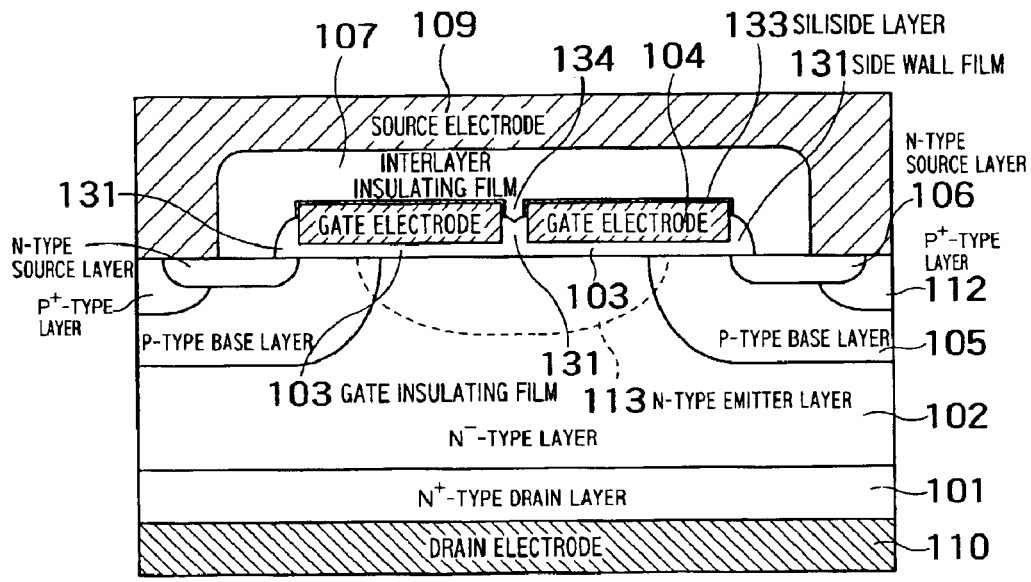
FIG. 21 is a sectional view of a semiconductor device according to an eleventh embodiment of the present invention.

FIG. 21 is a sectional view of a semiconductor device according to an eleventh embodiment of the present invention.

As compared with the semiconductor device according to the tenth embodiment of the present invention shown in FIG. 20, the semiconductor device according to the eleventh embodiment of the present invention further has P type high concentration layers 112 which are formed at the surface layer portions of the P type base layers 105 at the contact regions with the source electrode 109, and which have an impurity concentration higher than that of the P type base layer 105.

By the P type high concentration layer 112 being formed, the contact between the P type base layer 105 and the source electrode 109 is more reliable, and improvement of resistance to the breakage of the element can be attempted.

Note that the P type high concentration layer 112 may be formed at the semiconductor devices according to the seventh, eighth, and ninth embodiments of the present invention which were shown in FIG. 16, FIG. 17, and FIG. 19.

Figure 22:
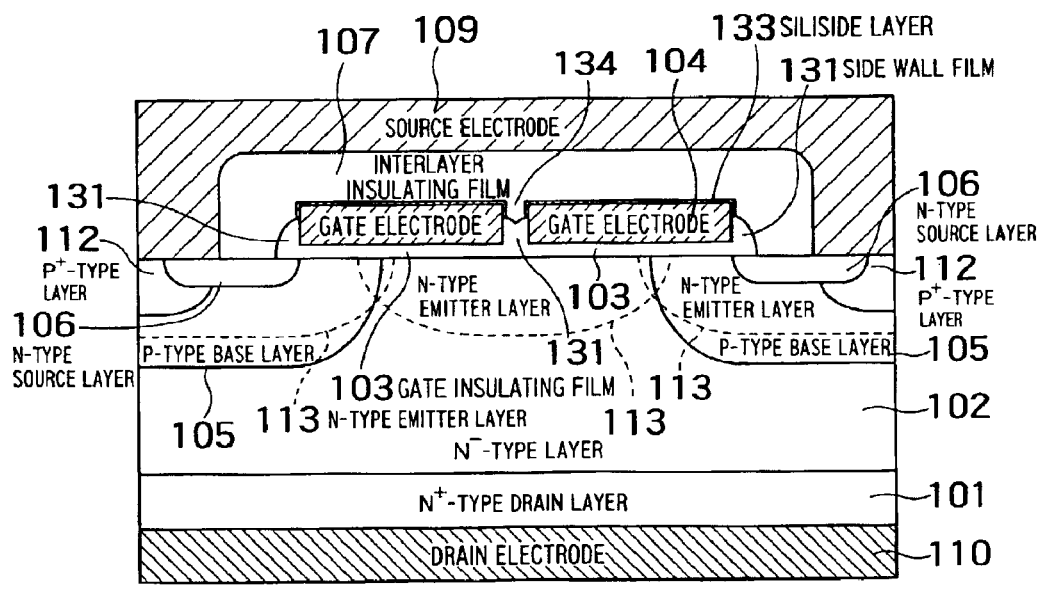
FIG. 22 is a sectional view of a semiconductor device according to a twelfth embodiment of the present invention.

FIG. 22 is a sectional view of a semiconductor device according to a twelfth embodiment of the present invention.

As compared with the semiconductor device according to the eleventh embodiment of the present invention shown in FIG. 21, the semiconductor device according to the twelfth embodiment of the present invention has the N type emitter layers 113 (high concentration layer) which are formed not only at the surface layer portion of the N type semiconductor layer 102 directly beneath the slit portion 134 of the gate electrode 104, but also at the surface layer portions of the N type semiconductor layer 102 directly beneath the both end portions of the gate electrode 104, and which have an impurity concentration higher than that of the N type semiconductor layer 102 and lower than that of the P type base layer 105.

When the N type emitter layer 113 is formed at the surface layer portion of the N type semiconductor layer 102 directly beneath the slit portion 134 of the gate electrode 104, at the time of the impurity injection for forming the N type emitter layer 113, usually, the region other than the slit portion 134 is protected by a resist in advance.

However, the dosage amount of the impurity injection for forming the N type emitter layer 113 is, for example, by one digit or more, less than or equal to the dosage amount of the impurity injection for forming the P type base layer 105. Therefore, even if the region other than the slit portion 134 is not protected by a resist at the time of the impurity injection for forming the N type emitter layer 113, the formation of the P type base layer 105 is not substantially affected.

Accordingly, by omitting the formation of a resist at the time of the impurity injection for forming the N type emitter layer 113, the number of manufacturing processes can be decreased, and the manufacturing cost can be reduced.

Note that the above-described structure may be applied to the semiconductor devices according to the eighth and tenth embodiments of the present invention shown in FIG. 17 and FIG. 20.

Figure 23:
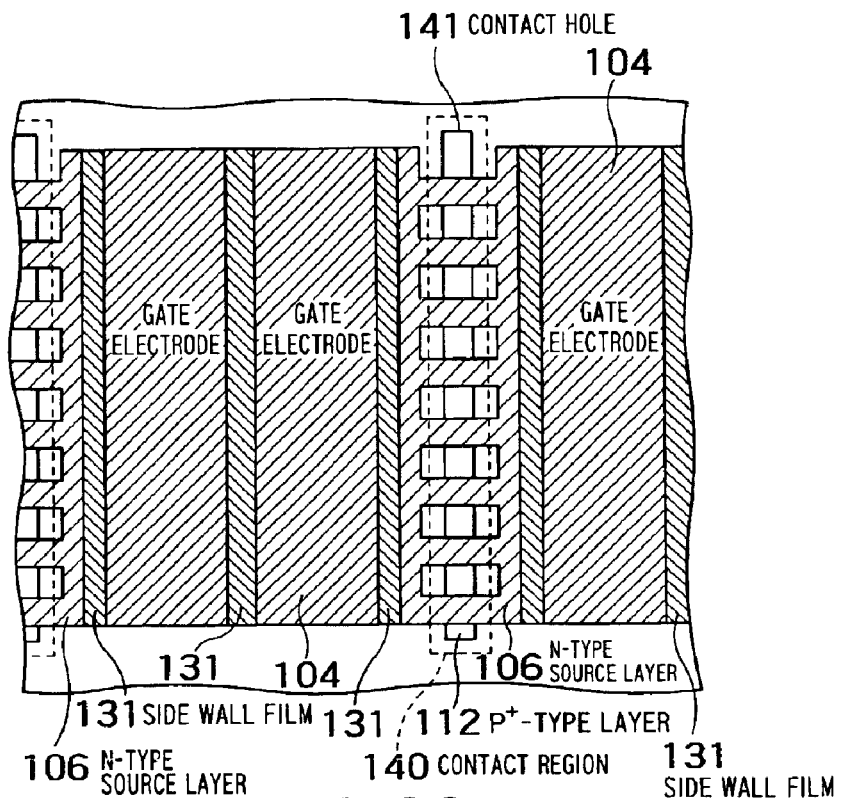
FIG. 23 is a plan view showing a first plan view structural example of the semiconductor devices according to the respective embodiments of the present invention.

FIG. 23 is a plan view showing a first plan view structural example of the semiconductor devices according to the respective embodiments of the present invention.

As integration of the element is improved and miniaturization of the element progresses, it becomes difficult to make both of the P type base layer 105 and the N type source layer 106 be reliably in contact with the source electrode 109 at the same time.

Therefore, in the element which has been formed to be minute, in order to make both of the P type base layer 105 and the N type source layer 106 be reliably in contact with the source electrode 109 at the same time, as shown in FIG. 23, the plan view structure of the N type source layer 106 may be made to be a ladder shape.

Note that the present structural example can be applied to not only the semiconductor devices according to the respective embodiments of the present invention which were described above, but also to the respective semiconductor devices according to the respective embodiments of the present invention which will be described later.

Figure 24:
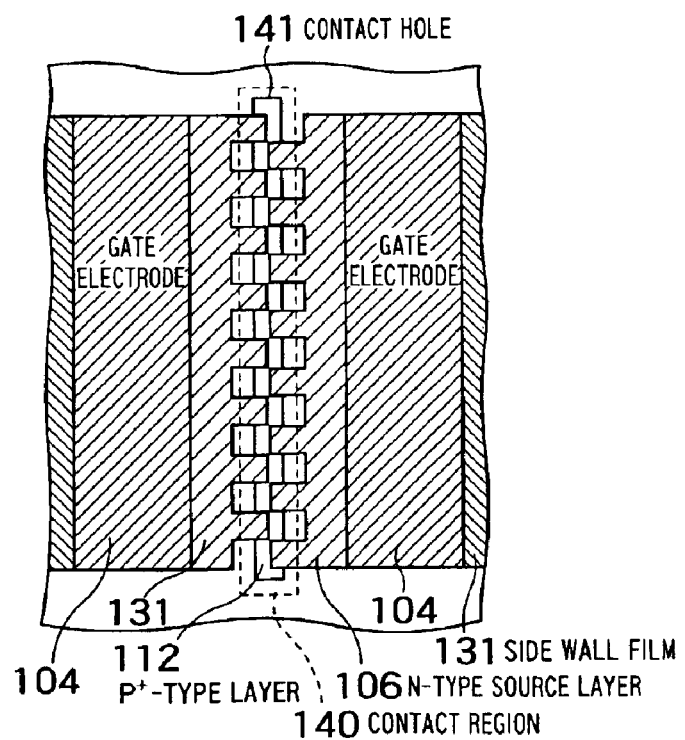
FIG. 24 is a plan view showing a second plan view structural example of the semiconductor devices according to the respective embodiments of the present invention.

FIG. 24 is a plan view showing a second plan view structural example of the semiconductor devices according to the respective embodiments of the present invention.

In the second plan view structural example shown in FIG. 24, there is a plan view structure which is in the shape of teeth of two combs in which the N type source layer 106 formed at one element and the N type source layer 106 formed the other element adjacent to the one element are alternately combined with one another.

Because the path of the positive hole current flowing at the time of switching of the element is dispersed by using such a plan view structure in the N type source layer 106, improvement of resistance to the breakage of the element can be attempted.

Note that the present structural example can be applied to not only the semiconductor devices according to the respective embodiments of the present invention which were described above, but also to the respective semiconductor devices according to the respective embodiments of the present invention which will be described later.

Figure 25:
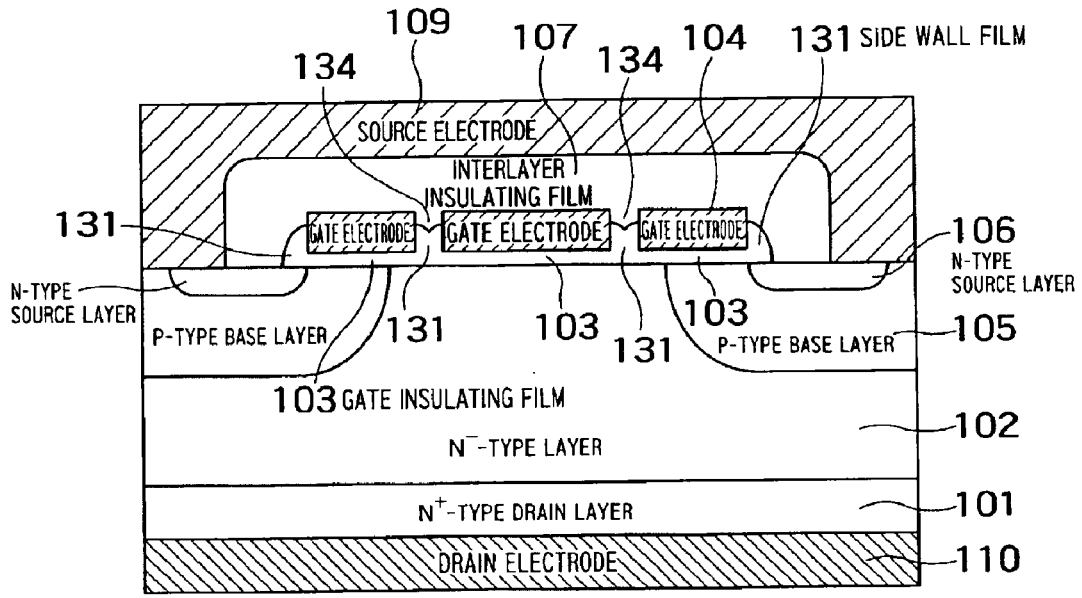
FIG. 25 is a sectional view of a semiconductor device according to a thirteenth embodiment of the present invention.

FIG. 25 is a sectional view of a semiconductor device according to a thirteenth embodiment of the present invention.

In the semiconductor device according to the seventh embodiment of the present invention shown in FIG. 16, the slit portion 134 is formed only at the central portion of the gate electrode 104. On the other hand, in the semiconductor device according to the thirteenth embodiment of the present invention shown in FIG. 25, the slit portions 134 are respectively formed at the one end portion side and the other end portion side from the central portion of the gate electrode 104.

In this way, by increasing the number of places where the slit portions 134 are provided and enlarging the volume of the slit portions 134, the gate capacity is further reduced, and it is possible to attempt to make the switching speed of the semiconductor device to be fast.

The places where the slit portions 134 are provided are not limited to one place or two places, and may be greater than or equal to three places.

Note that the above-described structure may be applied to the semiconductor device according to the ninth embodiment of the present invention shown in FIG. 19.

Figure 26:
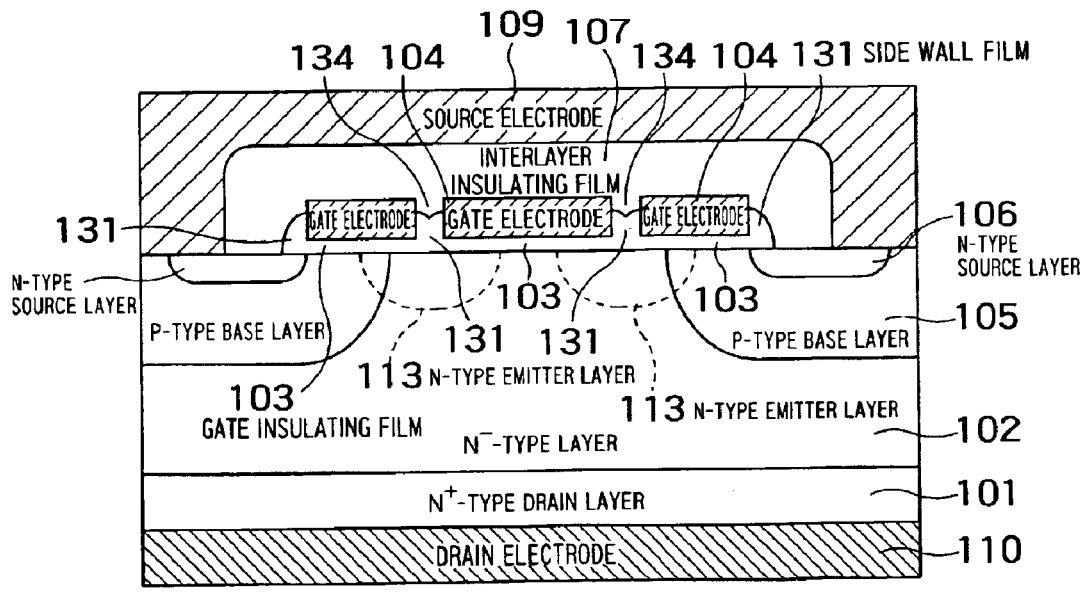
FIG. 26 is a sectional view of a semiconductor device according to a fourteenth embodiment of the present invention.

FIG. 26 is a sectional view of a semiconductor device according to a fourteenth embodiment of the present invention.

In the semiconductor device according to the eighth embodiment of the present invention shown in FIG. 17, the slit portion 134 is formed only at the central portion of the gate electrode 104. On the other hand, in the semiconductor device according to the fourteenth embodiment of the present invention shown in FIG. 26, the slit portions 134 are respectively formed at the one end portion side and the other end portion side from the central portion of the gate electrode 104.

In the semiconductor device according to the eighth embodiment of the present invention, the N type emitter layer 113 is formed at only one place which is the central portion of the surface layer portion of the N type semiconductor layer 102 directly beneath the slit portion 134. However, accompanying the increase the places where the slit portions 134 are provided from one place to two places, in the semiconductor device according to the fourteenth embodiment of the present invention, the N type emitter layers 113 are formed at two places which are the P type base layer 105 side of one side and the P type base layer 105 side of the other side from the central portion of the surface layer portion of the N type semiconductor layer 102 directly beneath the slit portion 134. Further, the N type emitter layers 113 at the two places are respectively formed such that a part of the P type base layer 105 at the one side and a part of the P type base layer 105 at the other side are overlapped.

As described in the explanation of the semiconductor device according to the eighth embodiment of the present invention, in a planar type power MOSFET, the current path is configured from the N type semiconductor layer 102 at the portion sandwiched by the two P type base layers 105. Further, because the length of the channel formed at the surface of the P type base layer 105 is usually determined by the horizontal diffusion distance of the P type base layer 105, as a result, the length of the channel is determined by the vertical diffusion distance of the P type base layer 105 having a proportional relationship with the horizontal diffusion distance thereof.

However, as described above, the width of the current path can be enlarged by forming the N type emitter layer 113 having an impurity concentration which is higher than that of the N type semiconductor layer 102 and lower than that of the P type base layer 105. Accordingly, it is possible to change the length of the channel by forming the N type emitter layer 113.

In the semiconductor device according to the fourteenth embodiment of the present invention, the slit portions 134 are respectively formed at the one end portion side and the other end portion side from the central portion of the gate electrode 104. However, the positions of the slit portions 134 can be arbitrarily set. Accordingly, positions where the N type emitter layers 113 are formed can be arbitrarily set by setting the positions of the slit portions 134 and using the gate electrode 104 having these slit portions 134 as a mask.

Therefore, if the respective slit portions 134 are respectively provided at the vicinities of the boundary between the P type base layer 105 and the N type semiconductor layer 102, and the respective emitter layers 113 are respectively formed such that a part of the P type base layer 105 at the one side and a part of the P type base layer 105 at the other side are overlapped, the length of the channel formed at the surface of the P type base layer 105 can be arbitrarily set.

Namely, in accordance with the semiconductor device according to the fourteenth embodiment of the present invention, the length of the channel formed at the surface of the P type base layer 105 can be arbitrarily set without depending on the vertical diffusion distance of the P type base layer 105, and the ability of the current to flow through of the element can be easily improved.

Furthermore, the N type emitter layer 113 can be formed in advance before forming the gate electrode 104. However, as described above, if the N type emitter layer 113 is diffusion-formed by carrying out impurity injection by using the gate electrode 104 itself as a mask at which the slit portions 134 are formed, so-called matching offset can be avoided, and the N type emitter layer 113 can be formed at a sufficient positional accuracy.

Note that the above-described structure may be applied to the semiconductor devices according to the ninth, tenth, eleventh, and twelfth embodiments which are shown in FIG. 19, FIG. 20, FIG. 21, and FIG. 22.

Figure 27:
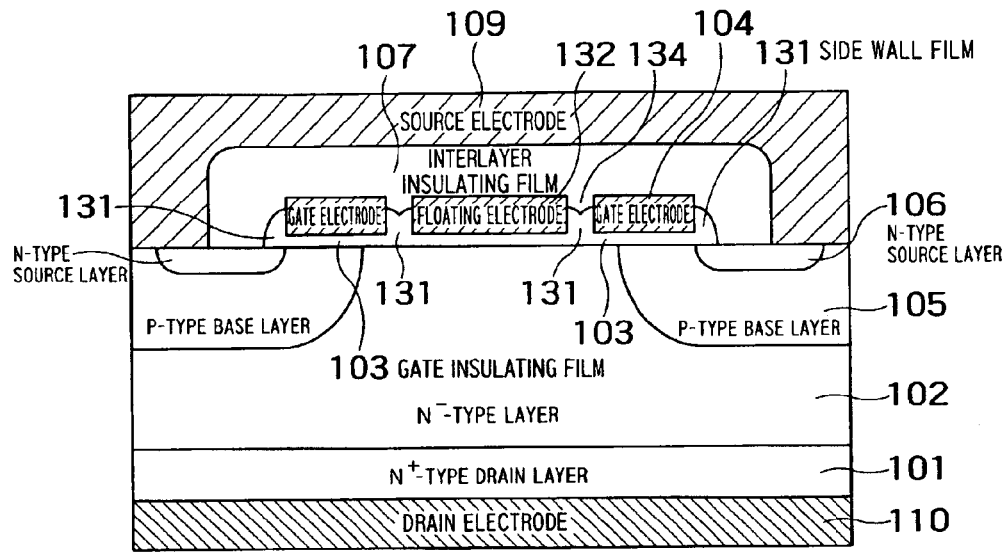
FIG. 27 is a sectional view of a semiconductor device according to a fifteenth embodiment of the present invention.

FIG. 27 is a sectional view of a semiconductor device according to a fifteenth embodiment of the present invention.

In the semiconductor device according to the thirteenth embodiment of the present invention shown in FIG. 25, the respective partial electrodes of the gate electrode 104 divided into three by the slit portions 134 at the two places function as the gate electrodes. On the other hand, in the semiconductor device according to the fifteenth embodiment of the present invention shown in FIG. 27, the central partial electrode, among the respective partial electrodes of the gate electrode 104 divided into three by the slit portions 134 at the two places, is a floating electrode 132 electrically separated from the two both end partial electrodes and the gate wiring.

Because gate voltage is not applied to the floating electrode 132, the gate capacity is reduced by an amount corresponding to the floating electrode 132, and it is possible to attempt to make the switching speed of the semiconductor device to be fast.

The places where the slit portions 134 are provided are not limited to the two places, and may be greater than or equal to three places. In this case as well, all or some of the respective partial electrodes sandwiched by the two both end partial electrodes may be made to be floating electrodes.

Note that the above-described structure may be applied to the semiconductor device according to the ninth embodiment of the present invention shown in FIG. 19.

Figure 28:
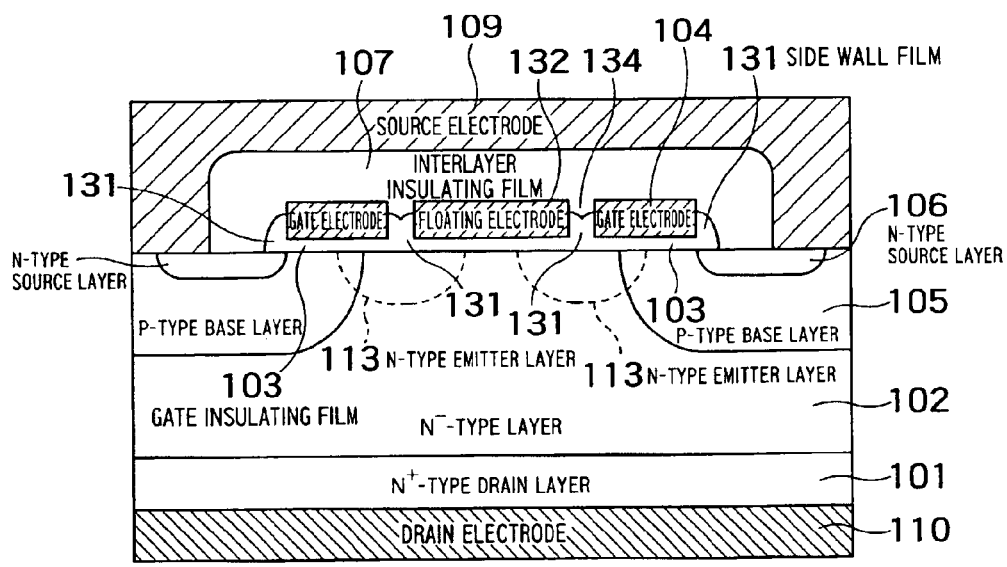
FIG. 28 is a sectional view of a semiconductor device according to a sixteenth embodiment of the present invention.

FIG. 28 is a sectional view of a semiconductor device according to a sixteenth embodiment of the present invention.

In the semiconductor device according to the fourteenth embodiment of the present invention shown in FIG. 26, the respective partial electrodes of the gate electrode 104 divided into three by the slit portions 134 at the two places function as the gate electrodes. On the other hand, in the semiconductor device according to the sixteenth embodiment of the present invention shown in FIG. 28, the central partial electrode, among the respective partial electrodes of the gate electrode 104 divided into three by the slit portions 134 at the two places, is a floating electrode 132 electrically separated from the two both end partial electrodes and the gate wiring.

Because gate voltage is not applied to the floating electrode 132, in the same way as in the semiconductor device according to the fifteenth embodiment of the present invention shown in FIG. 27, the gate capacity is reduced by an amount corresponding to the floating electrode 132, and it is possible to attempt to make the switching speed of the semiconductor device to be fast.

The places where the slit portions 134 are provided are not limited to the two places, and may be greater than or equal to three places. In this case as well, all or some of the respective partial electrodes sandwiched by the two both end partial electrodes may be made to be floating electrodes.

Note that the above-described structure may be applied to the semiconductor devices according to the ninth, tenth, eleventh, and twelfth embodiments of the present invention shown in FIG. 19, FIG. 20, FIG. 21, and FIG. 22.

Next, methods for manufacturing the semiconductor devices according to the seventh through the sixteenth embodiments of the present invention will be described.

Because there are a large number of common portions in the manufacturing processes of the semiconductor devices according to the seventh through the sixteenth embodiments of the present invention, here, two manufacturing methods will be described by using, as an example, the semiconductor device according to the twelfth embodiment of the present invention shown in FIG. 22.

Figure 29A:
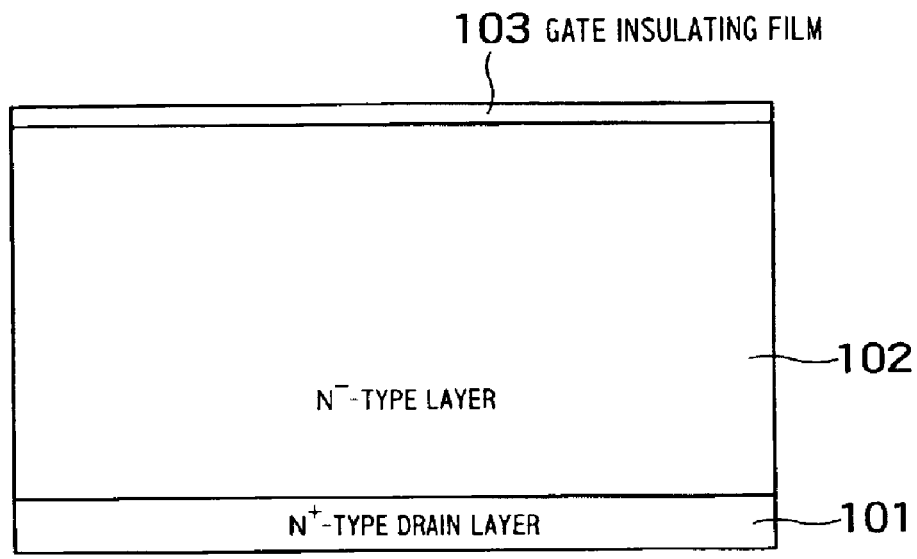
FIGS. 29A to 29N are respectively sectional views in one manufacturing process of a first method for manufacturing the semiconductor device according to the twelfth embodiment of the present invention.
Figure 29B:
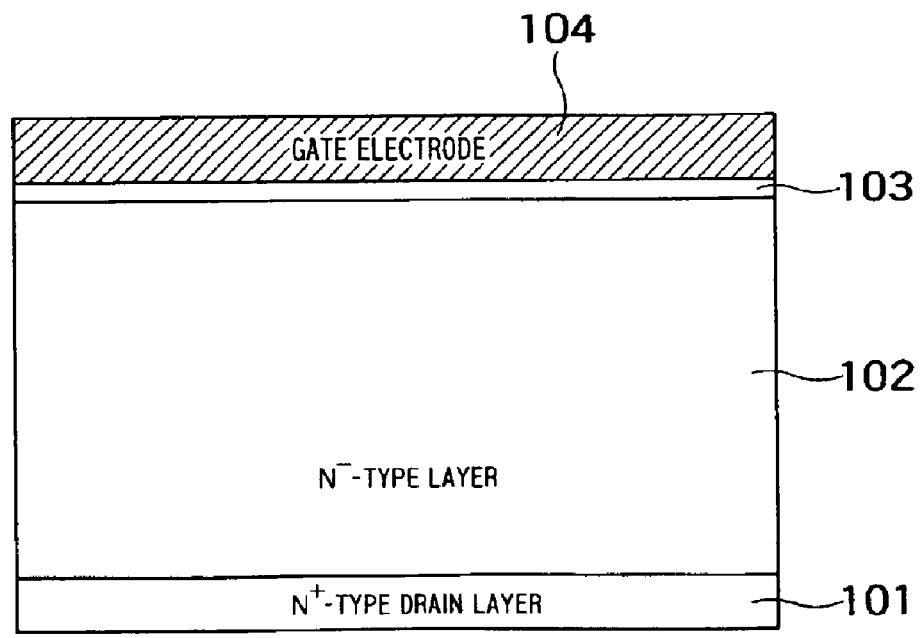
Figure 29C:
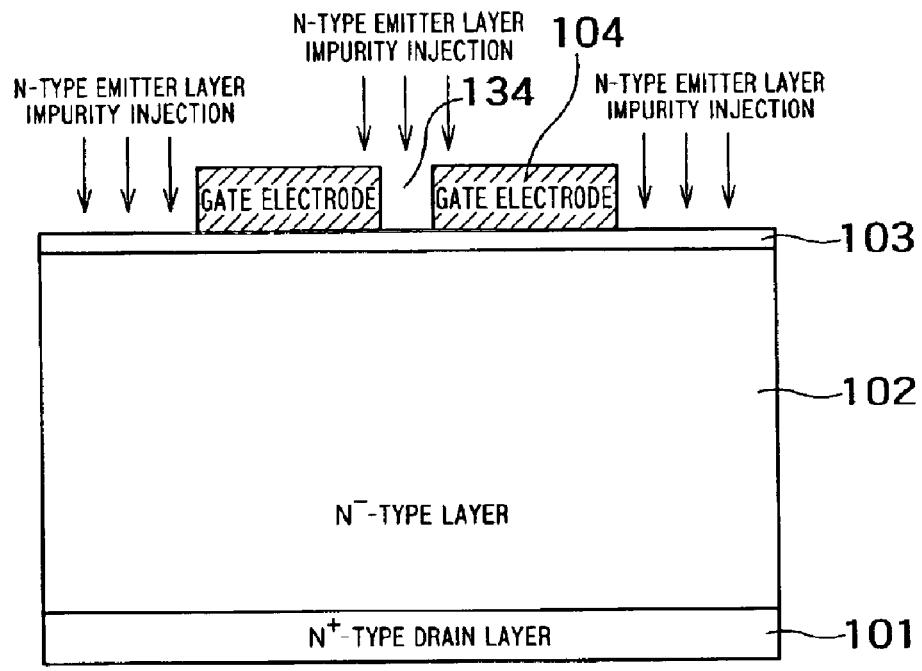
Figure 29D:
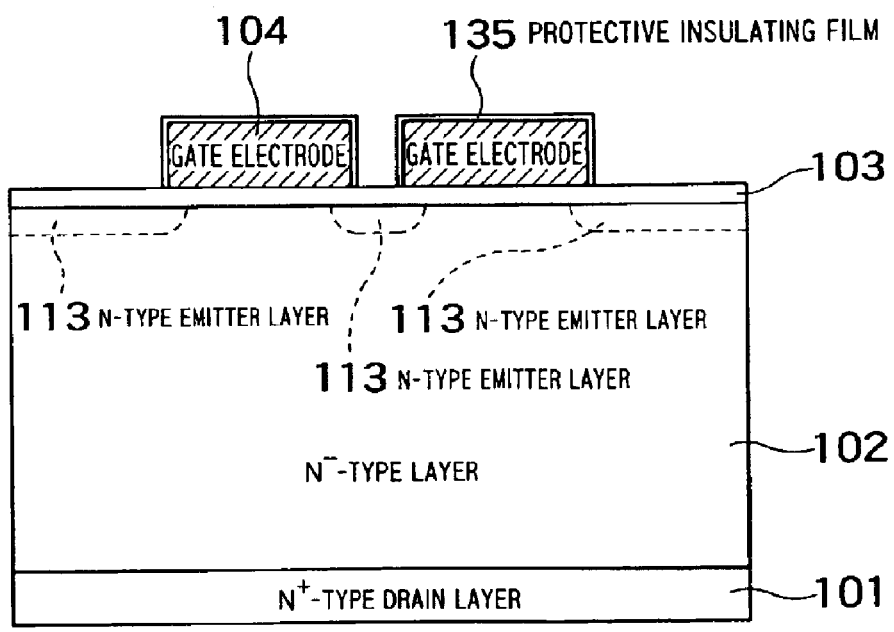
Figure 29E:
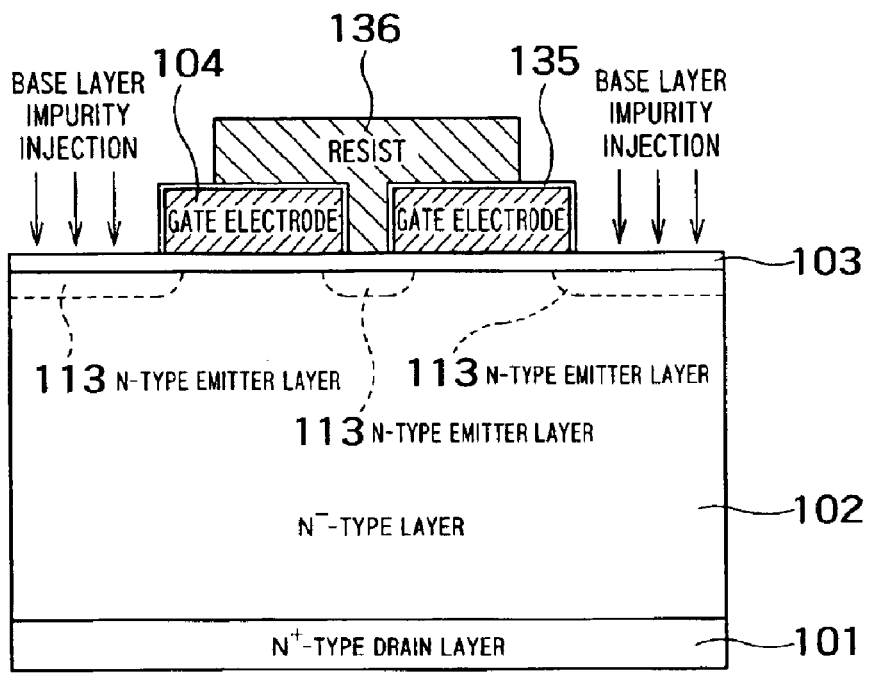
Figure 29F:
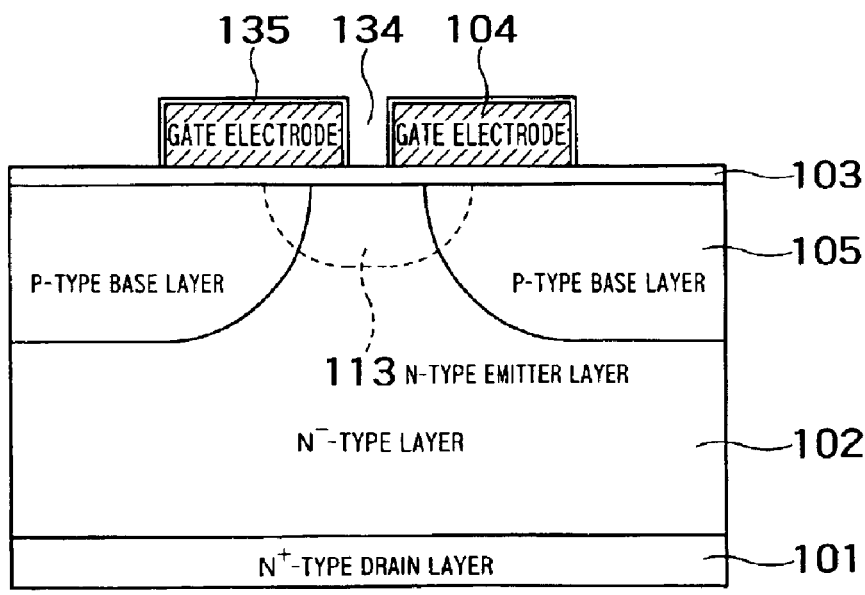
Figure 29G:
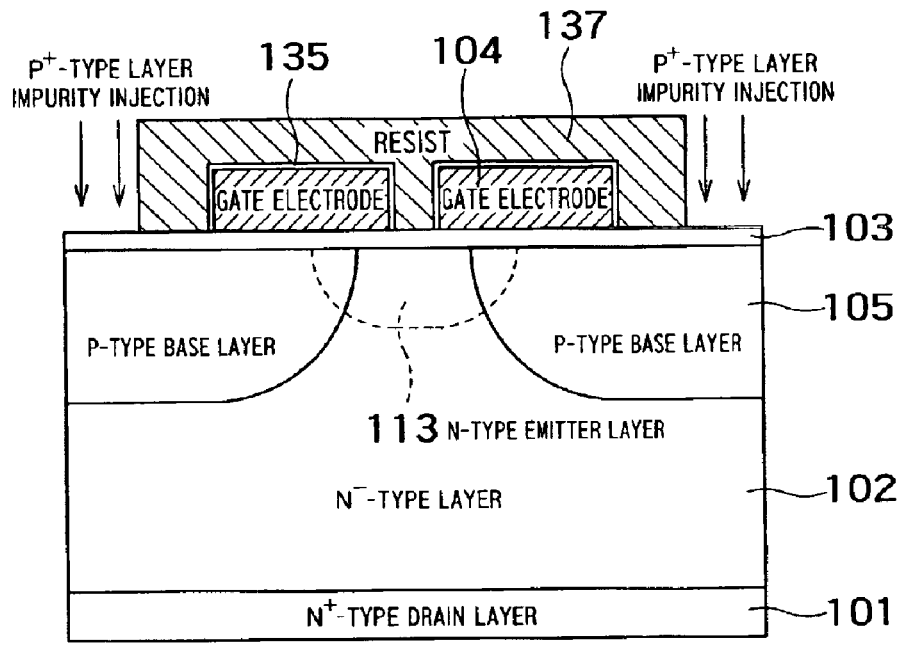
Figure 29H:
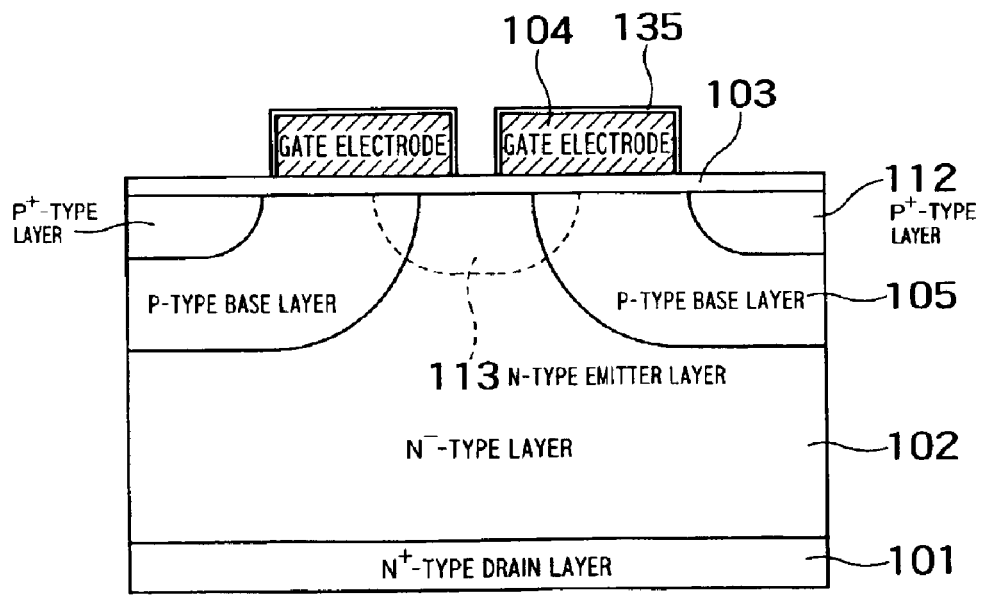
Figure 29I:
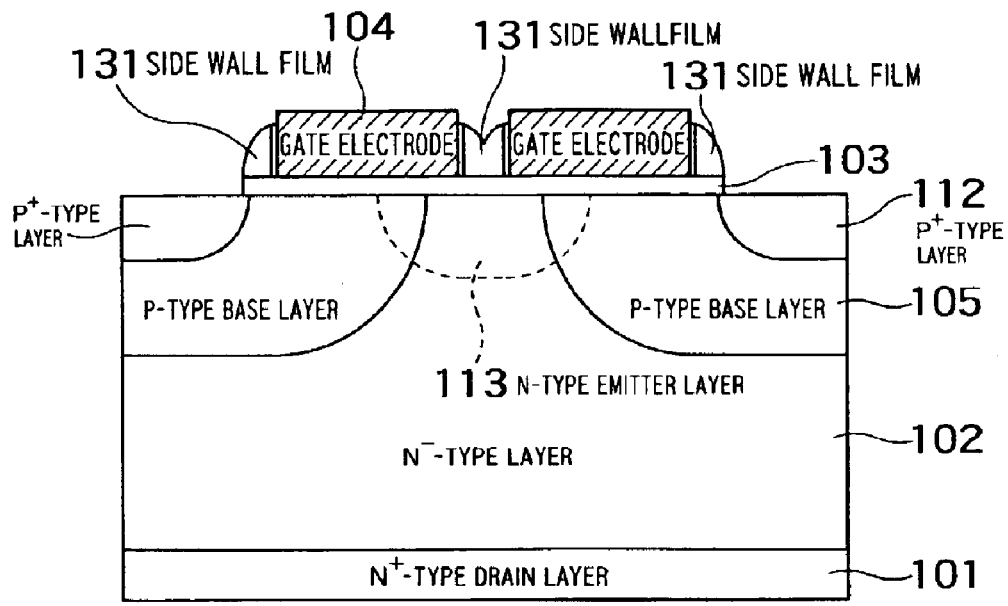
Figure 29J:
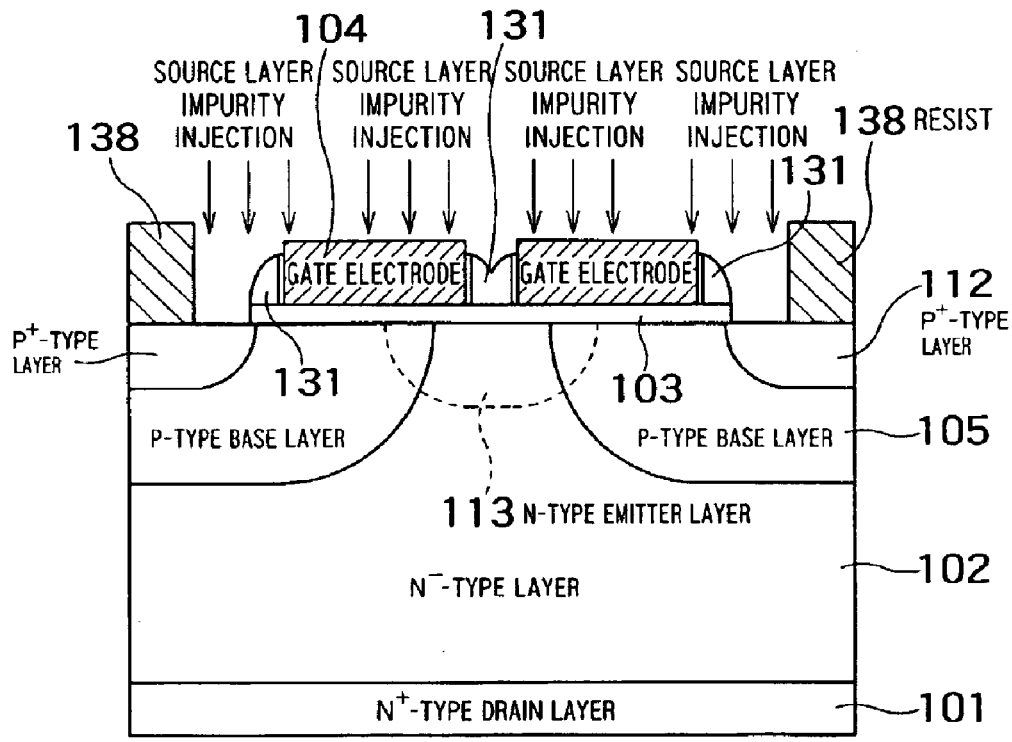
Figure 29K:
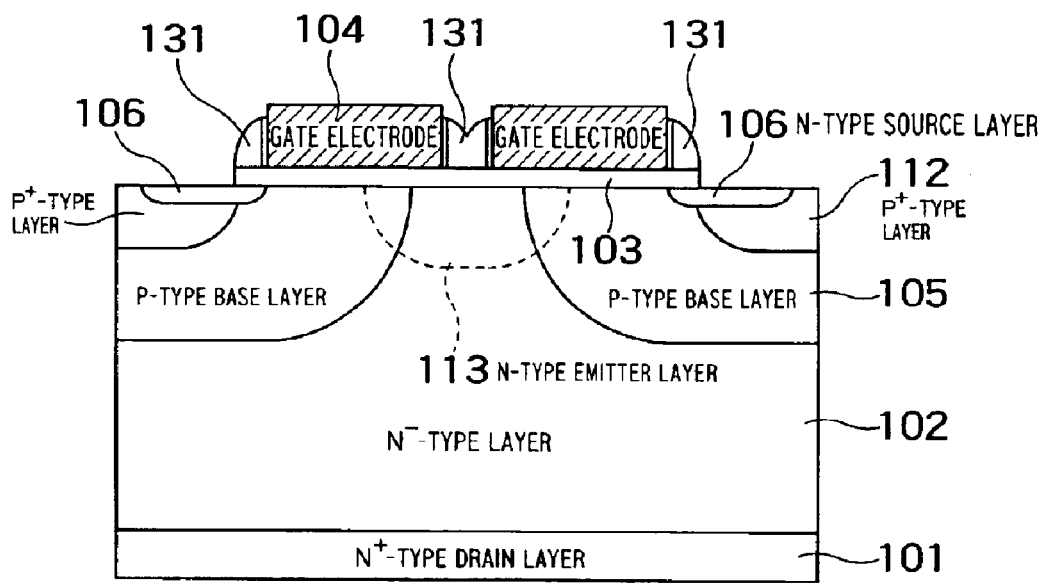
Figure 29L:
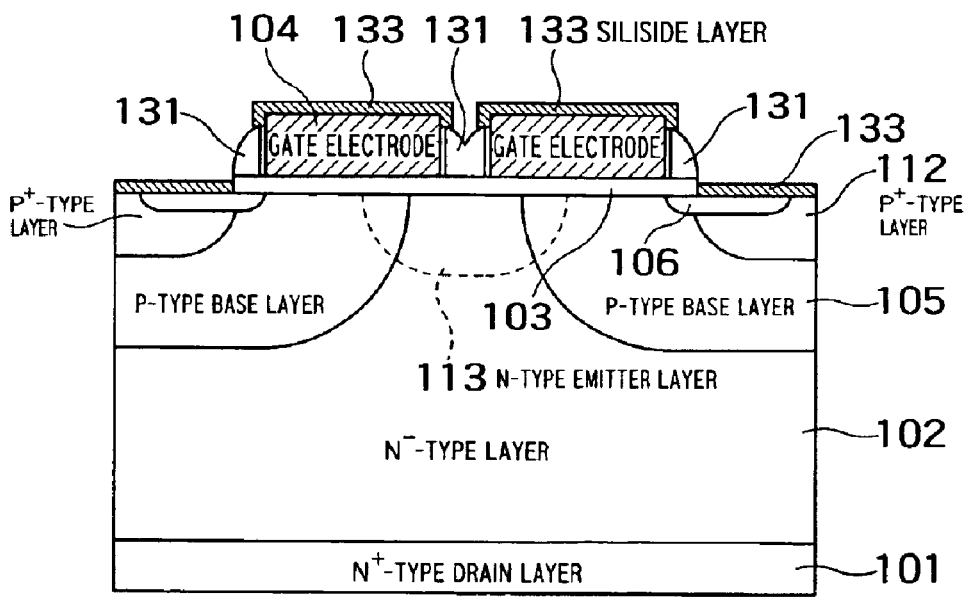
Figure 29M:
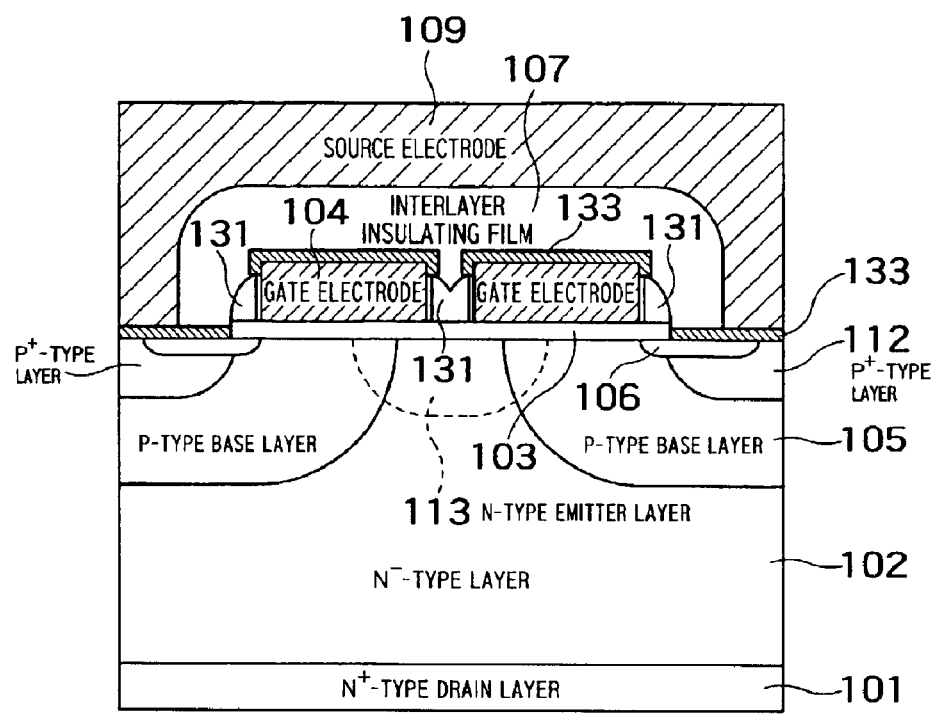
Figure 29N:
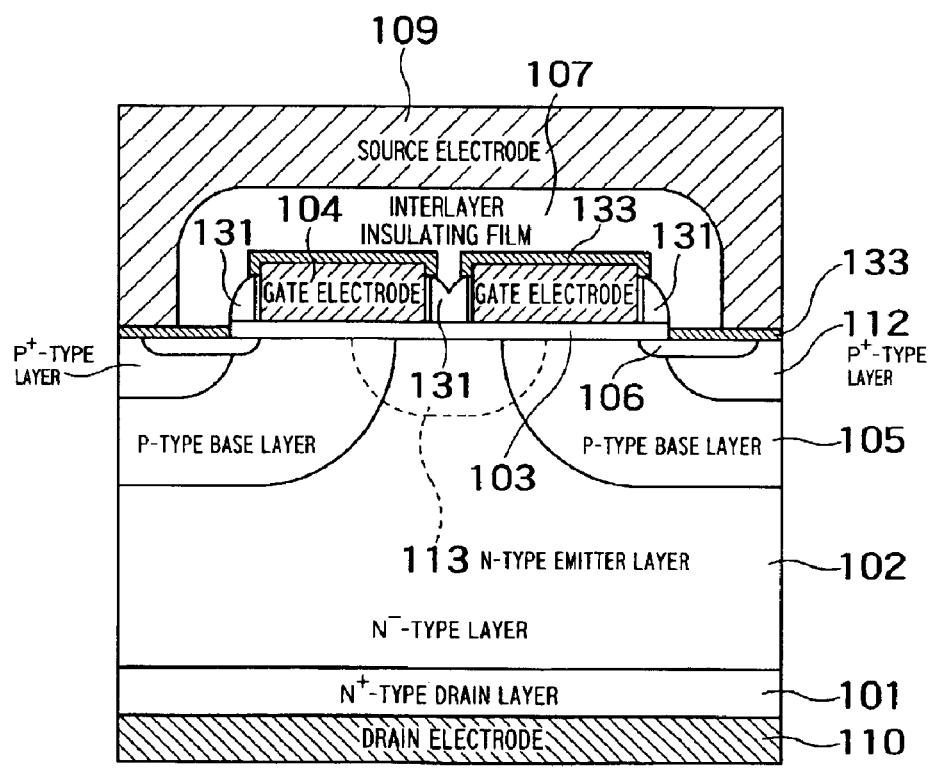

FIGS. 29A to 29N are sectional views of the respective manufacturing processes of a first method for manufacturing the semiconductor device according to the twelfth embodiment of the present invention.

First, as shown in FIG. 29A, an N⁻ type semiconductor (epitaxial) layer 102 having an impurity concentration which is lower than that of the N⁺ type drain layer 101 is formed by epitaxial growth on the N⁺ type semiconductor substrate (N+ type drain layer) 101 forming the N type high concentration drain layer. Further, a gate insulating film 103 is formed on the N⁻ type semiconductor layer 102.

After forming the gate insulating film 103, as shown in FIG. 29B, a gate electrode material which becomes the gate electrode 104 is deposited on the gate insulating film 103.

After depositing the gate electrode material, as shown in FIG. 29C, the gate electrode 104 is formed by carrying out patterning on the gate electrode material. When the gate electrode 104 is formed, the patterning is carried out such that the predetermined slit portions 134 are formed at the predetermined positions. When the gate electrode 104 is divided into three or more portions by forming the slit portions 134 at a plurality of places at the gate electrode 104, and some or all of the partial electrodes, other than the two both end partial electrodes, among the respective partial electrodes of the divided gate electrode 104 are made to be floating electrodes, the patterning is carried out such that the partial electrodes which are made to be floating electrodes are electrically separated from the both end partial electrodes and the gate wiring. Furthermore, impurity injection for forming the N type emitter layer (high concentration layer) 113 is carried out on the surface layer portion of the N type semiconductor layer 102 directly beneath the slit portion 134. The impurity injection for forming the N type emitter layer 113 is carried out such that the N type emitter layer 113 is made to have an impurity concentration which is higher than that of the N type semiconductor layer 102 and is lower than that of the P type base layer 105 which will be formed later. Note that the impurity injection for forming the N type emitter layer 113 may be carried out in advance before forming the gate insulating film 103.

After the patterning on the gate electrode material and the impurity injection for forming the N type emitter layer 113 are carried out, when the gate electrode material is polycilicon, the surface thereof oxidized in order to protect the surface of the gate electrode 104, and as shown in FIG. 29D, a protective insulating film 135 is formed on the surface of the gate electrode 104.

After forming the protective insulating film 135, as shown in FIG. 29E, the resist 136 for protecting the slit portion 134 of the gate electrodes 104 is formed, and the impurity injection for forming the P type base layer 105 is carried out on the surface layer portion of the N type semiconductor layer 102 at the both sides of the gate electrodes 104.

After removing the resist 136, as shown in FIG. 29F, the P type base layer 105 is diffusion-formed. At this time, the N type emitter layer 113 is diffusion-formed at the same time.

After diffusion-forming the P type base layer 105 and the N type emitter layer 113, as shown in FIG. 29G, the region, other than the portion which is the contact region with the source electrode 109 which will be formed later, is protected by being covered with the resist 137, and the impurity injection for forming the P type high concentration layer 112 is carried out as shown in FIG. 29G. The impurity injection for forming the P type high concentration layer 112 is carried out such that the P type high concentration layer 112 has an impurity concentration higher than that of the P type base layer 105.

After removing the resist 137, as shown in FIG. 29H, the P type high concentration layers 112 are diffusion-formed at the surface layer portions of the P type base layers 105.

After diffusion-forming the P type high concentration layers 112, by depositing insulating films such as an oxide film, a nitride film, or the like, and carrying out anisotropic etching, as shown in FIG. 29I, the side wall films 131 are formed at the both side faces of the gate electrodes 104 and at the side walls in the slit portion 134. Note that, at this time, the gate insulating film 103 at the outer portion of the gate region is removed.

After forming the side wall films 131, as shown in FIG. 29J, the portions which will be the contact regions between the source electrode 109 and the P type high concentration layers 112 among the portions which will be the contact regions with the source electrode 109 which will be formed later are protected by being covered with the resist 138, and the impurity injection for forming the N type source layer 106 is carried out. The region which is covered with the resist 138 is set such that the regions where the source electrode 109 can be in contact with the both of the P type high concentration layer 112 and the N type source layer 106 are ensured after diffusion-forming the N type source layer 106. Note that, when the P type high concentration layer 112 is not formed, the source electrode 109 is made to be in contact with the P type base layer 105.

In the semiconductor device according to the twelfth embodiment of the present invention, as illustrated, the slit portion 134 is formed at the gate electrode 104. Because the slit portion 134 is protected by the side wall film 131, it is not necessary to cover the slit portion 134 with the resist 138. Even when the gate electrode 104 is formed to be minute, it is not necessary to consider matching off set of the resist 138 for reliably protecting the slit portion 134. With respect to this point, the side wall film 131 is particularly effective. Note that, when the gate electrode material forming the gate electrode 104 is polysilicon, the impurity injection is carried out on the gate electrode 104 at the time of the impurity injection for forming the N type source layer 106.

After removing the resist 138, as shown in FIG. 29K, the N type source layer 106 is diffusion-formed.

When the gate electrode material is polysilicon, after diffusion-forming the N type source layer 106, the polysilicon on the top face of the gate electrode 104 is exposed by etching. Thereafter, due to a metal such as titanium, tungsten, molybdenum, or the like being deposited and being heat-treated at a temperature of 500 through 800° C., the polysilicon and the deposited metal layer are made to react with one another, and as shown in FIG. 29L, the silicide layer 133 is formed on the top face of the gate electrode 104. When the remaining metal which did not react is removed, the low-resistance gate electrode 104 having the silicide layer 133 at the top face is formed. Note that, when the silicide layer 133 is not formed, the present process may be omitted.

After forming the silicide layer 133, as shown in FIG. 29M, the gate electrode 104 is covered with the interlayer insulating film 107, and a contact hole is formed to be open at the interlayer insulating film 107 at the contact region between the source electrode 109, and the P type high concentration layer 112 and the N type source layer 106. Thereafter, the source electrode 109 is formed.

Moreover, as shown in FIG. 29N, the drain electrode 110 is formed at the rear face of the N+ drain layer 101, and the semiconductor device according to the twelfth embodiment of the present invention shown in FIG. 22 is completed.

Figure 30A:
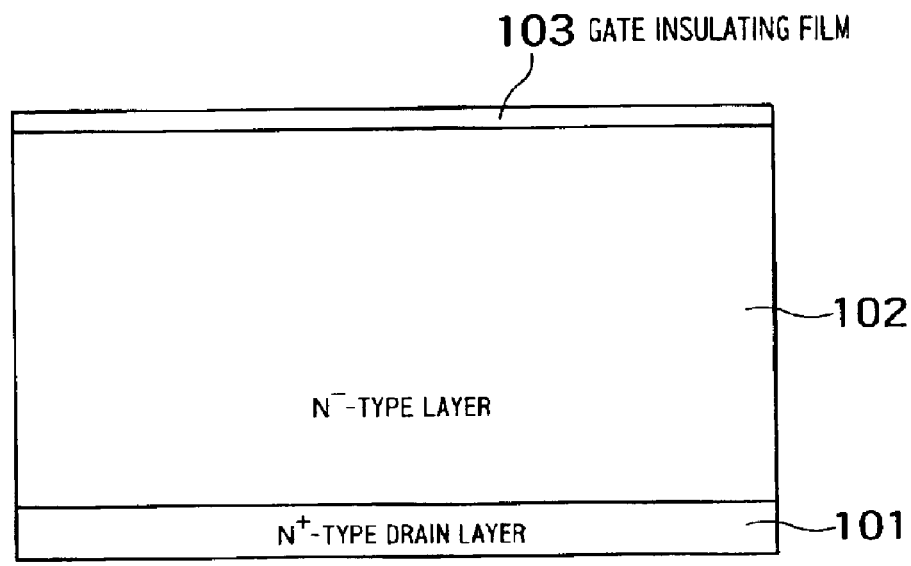
FIGS. 30A to 30N are respectively sectional views in one manufacturing process of a second method for manufacturing the semiconductor device according to the twelfth embodiment of the present invention.
Figure 30B:
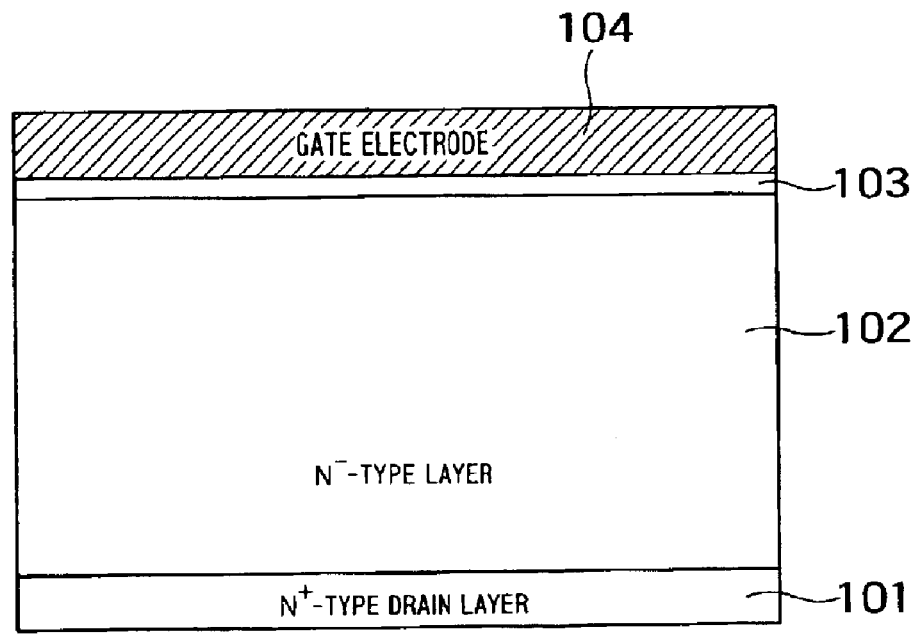
Figure 30C:
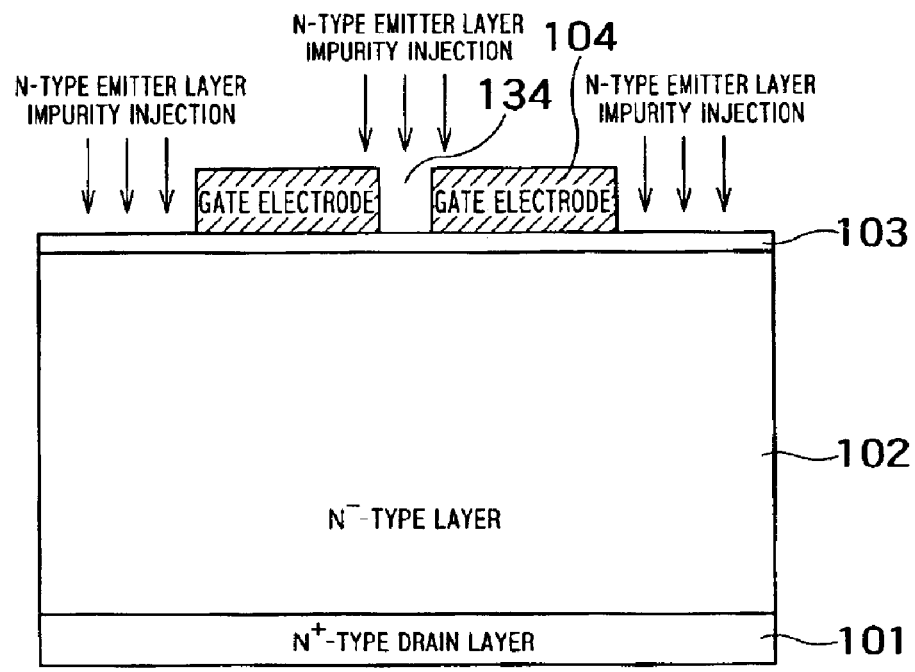
Figure 30D:
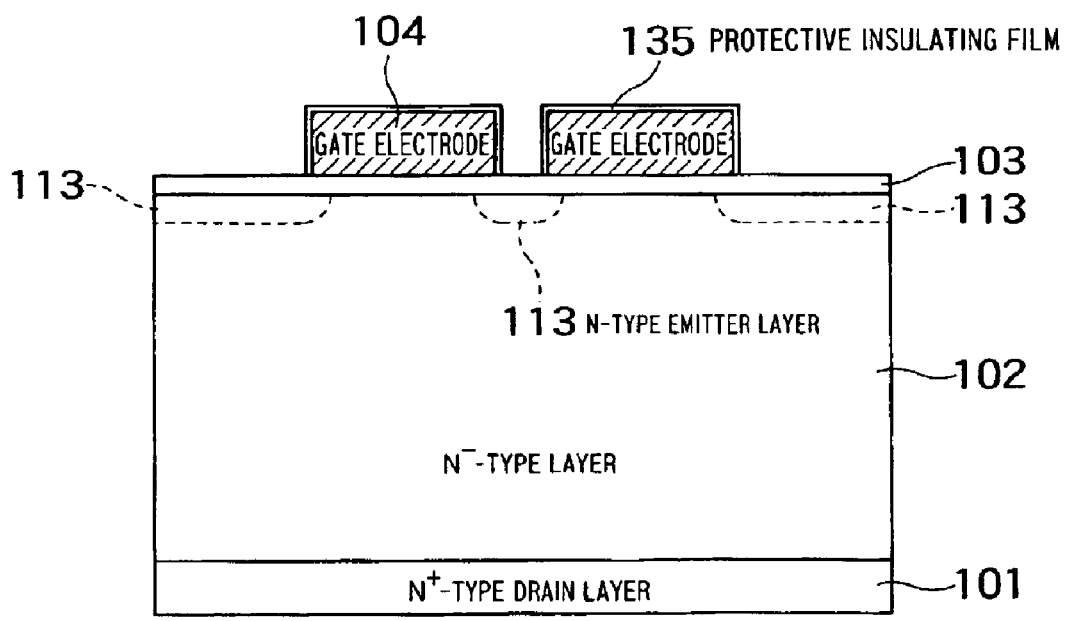
Figure 30E:
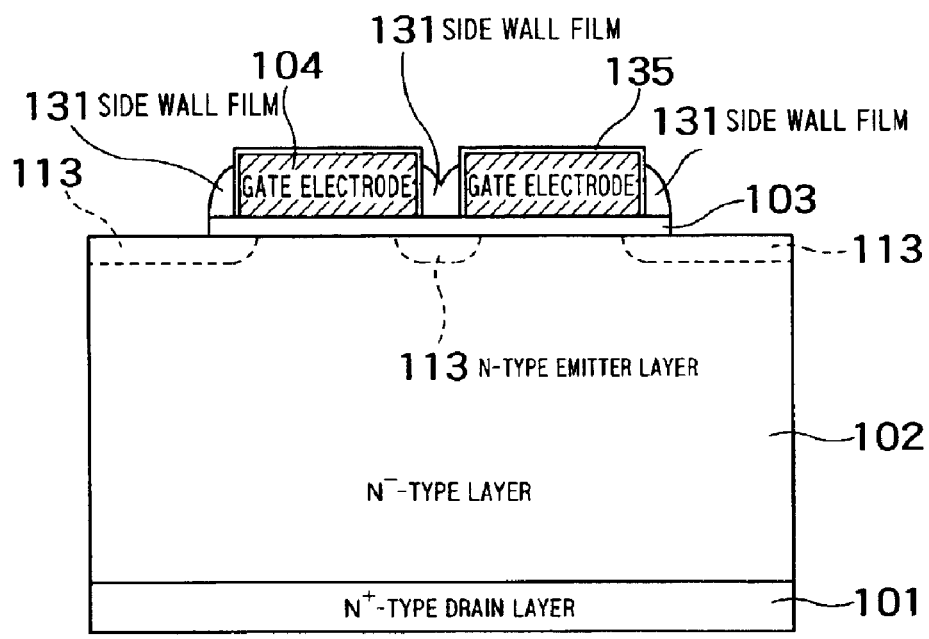
Figure 30F:
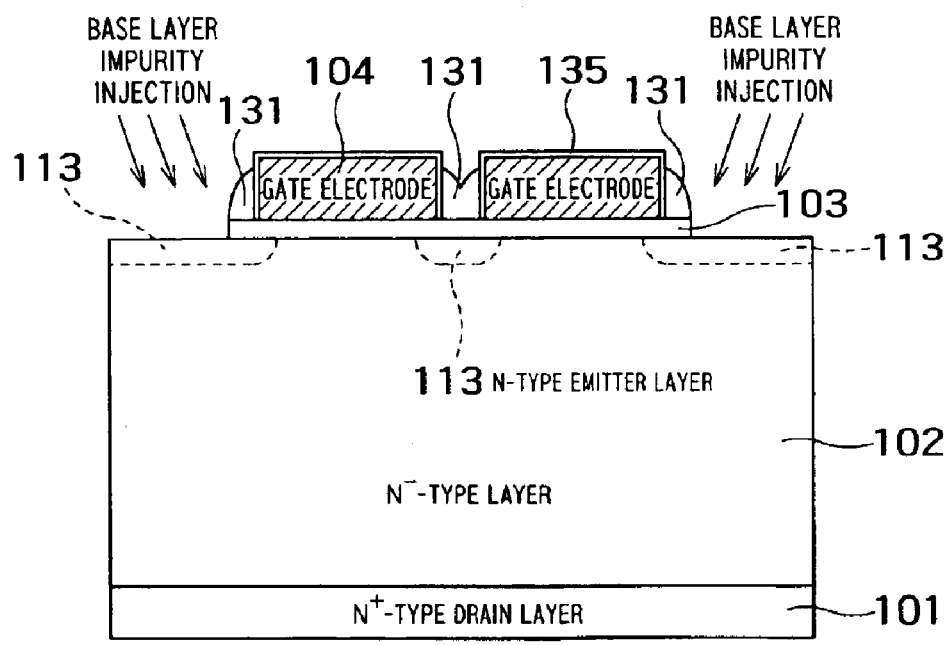
Figure 30G:
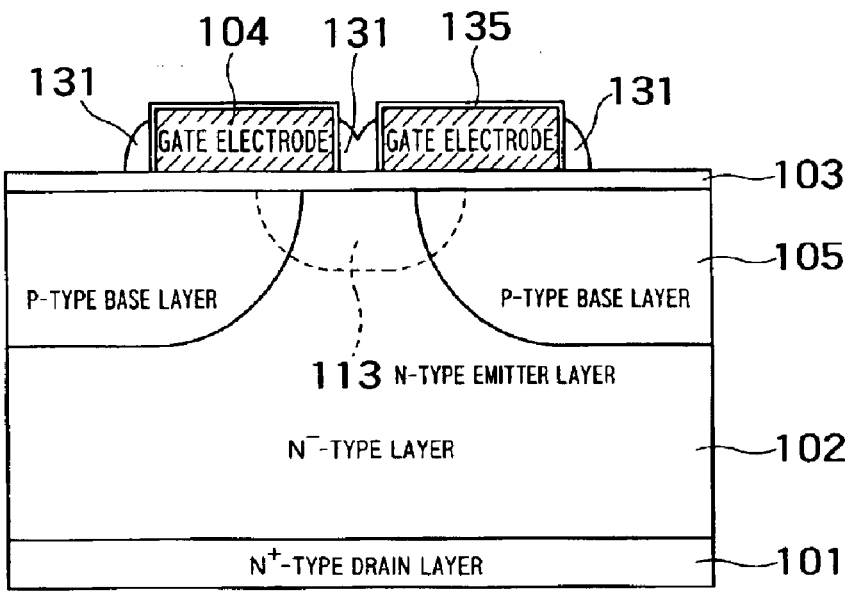
Figure 30H:
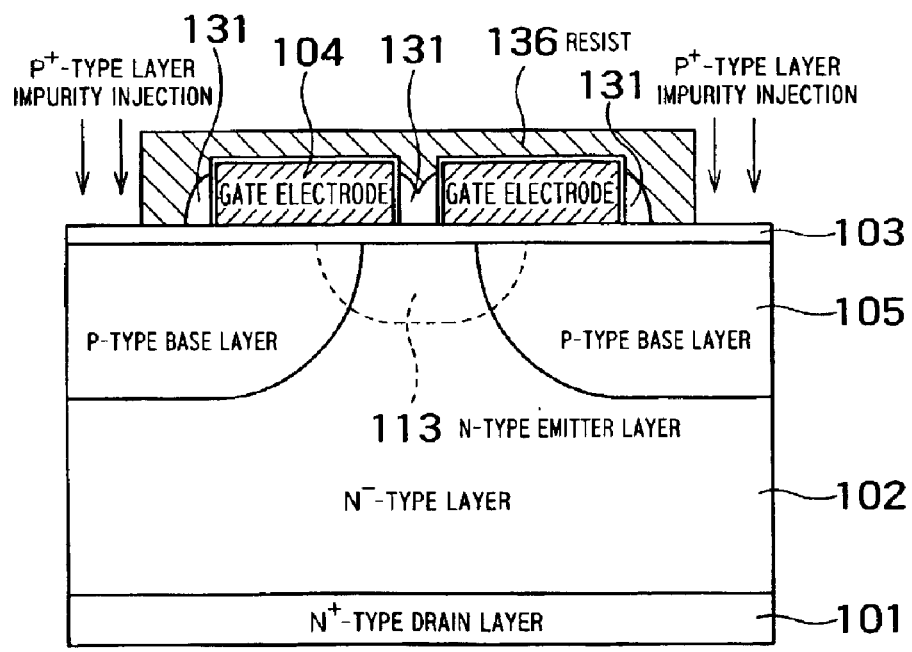
Figure 30I:
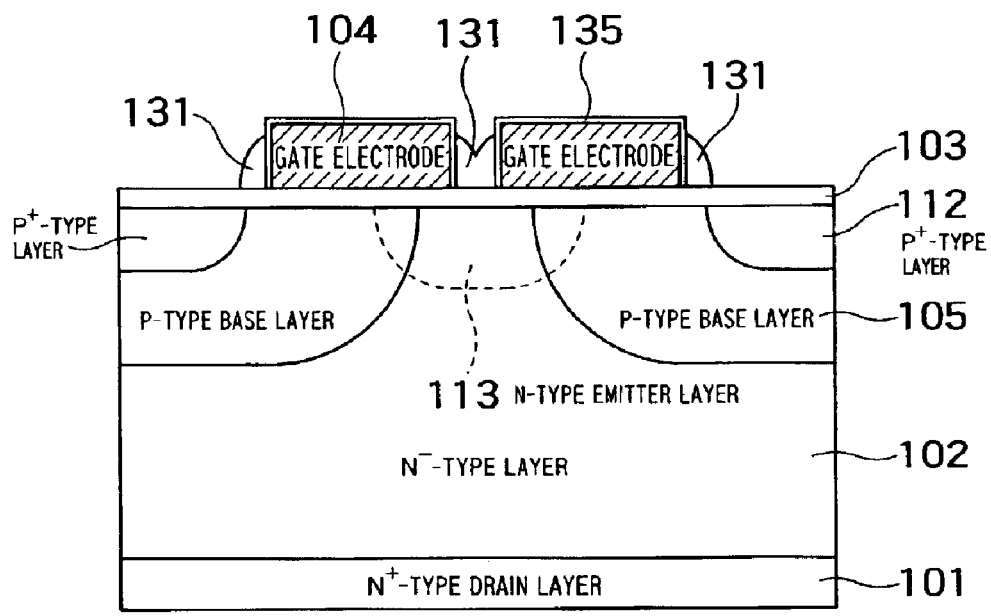
Figure 30J:
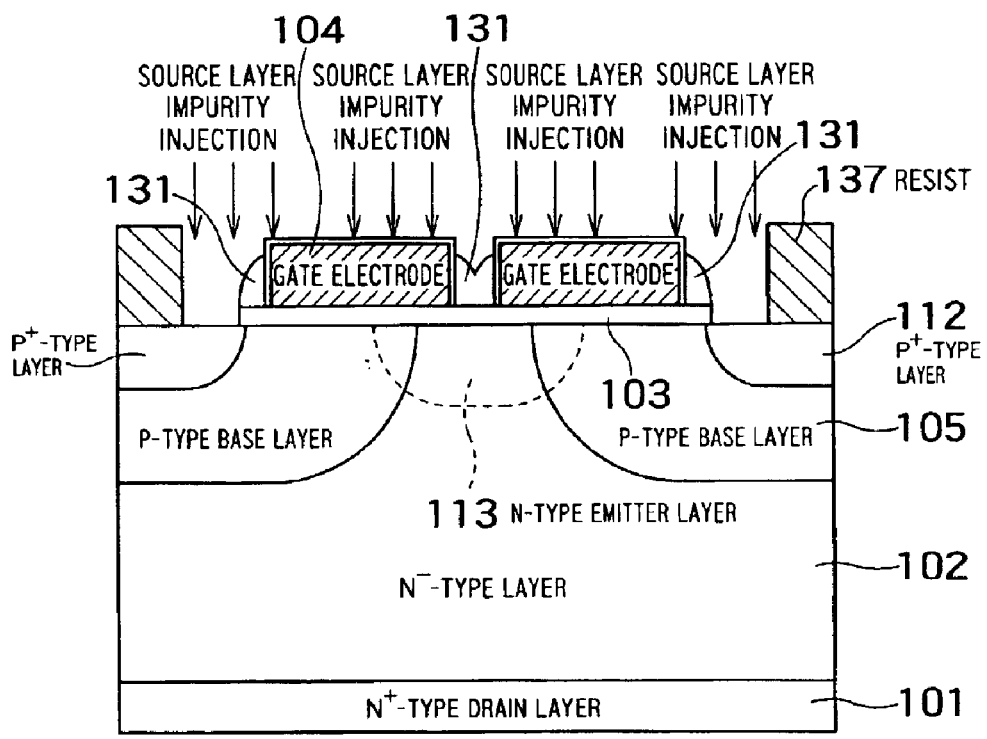
Figure 30K:
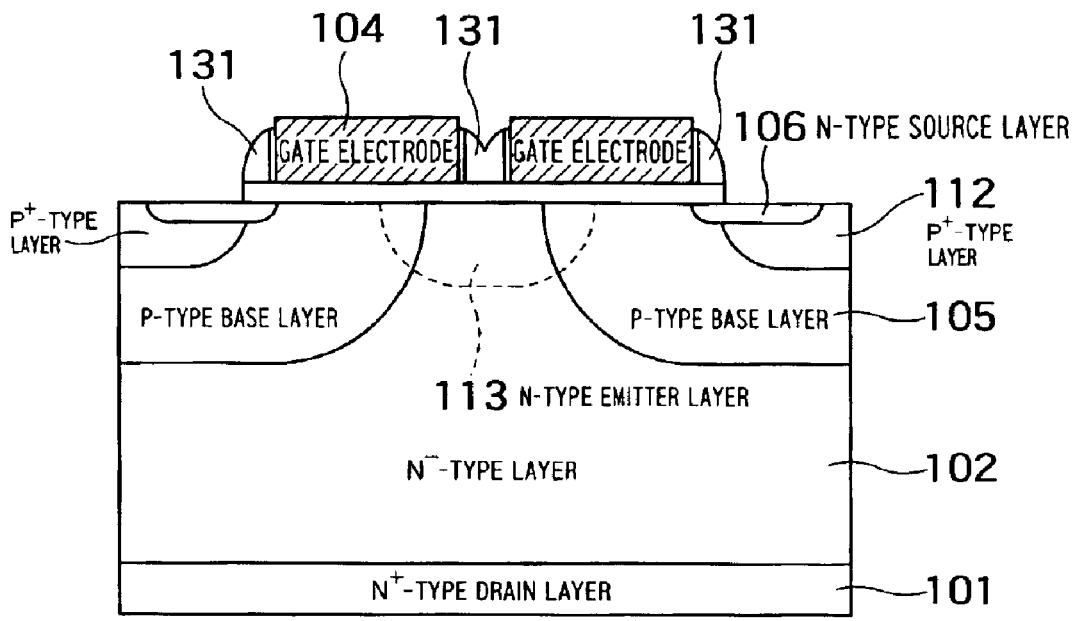
Figure 30L:
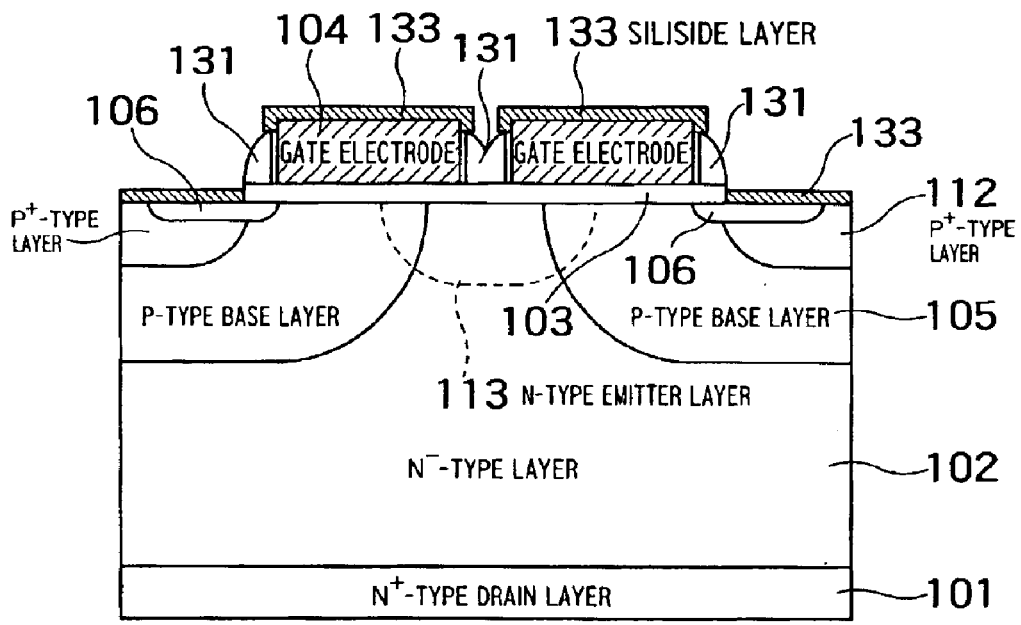
Figure 30M:
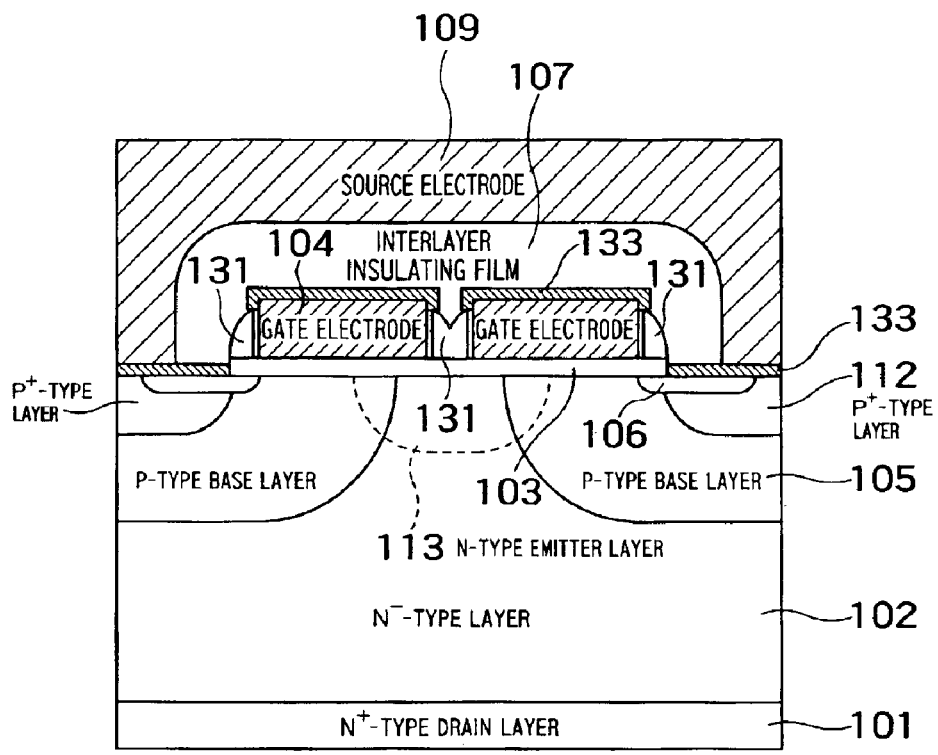
Figure 30N:
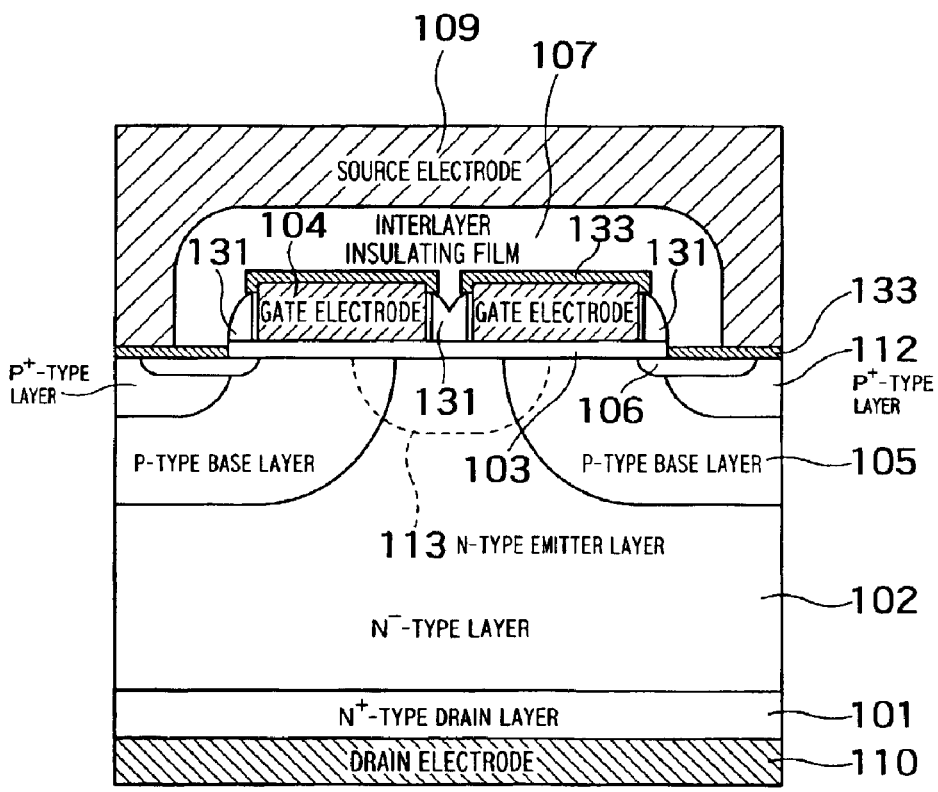

FIGS. 30A to 30N are sectional views of the respective manufacturing processes of a second manufacturing method of the semiconductor device according to the twelfth embodiment of the present invention.

First, as shown in FIG. 30A, an N⁻ type semiconductor (epitaxial) layer 102 having an impurity concentration lower than that of the N⁺ type drain layer 101 is formed by epitaxial growth on the N⁺ type semiconductor substrate (N+ type drain layer) 101 forming the N type high concentration drain layer, and a gate insulating film 103 is further formed on the N⁻ type semiconductor layer 102.

After forming the gate insulating film 103, as shown in FIG. 30B, a gate electrode material which becomes the gate electrode 104 is deposited on the gate insulating film 103.

After depositing the gate electrode material, as shown in FIG. 30C, the gate electrode 104 is formed by carrying out patterning on the gate electrode material. When the gate electrode 104 is formed, the patterning is carried out such that the predetermined slit portion 134 is formed at a predetermined position. When the gate electrode 104 is divided into three or more portions by forming the slit portions 134 at a plurality of places at the gate electrode 104, and some or all of the partial electrodes other than the two both end partial electrodes, among the electrodes of the respective partial electrodes of the divided gate electrode 104 are made to be floating electrodes, the patterning is carried out such that the partial electrodes which are made to be floating electrodes are electrically separated from the both end partial electrodes and the gate wiring. Furthermore, the impurity injection for forming the N type emitter layer (high concentration layer) 113 is carried out on the surface layer portion of the N type semiconductor layer 102 directly beneath the slit portion 134. The impurity injection for forming the N type emitter layer 113 is carried out such that the N type emitter layer 113 is made to have an impurity concentration which is higher than that of the N type semiconductor layer 102 and is lower than that of the P type base layer 105 which will be formed later. Note that the impurity injection for forming the N type emitter layer 113 may be carried out in advance before forming the gate insulating film 103.

After the patterning on the gate electrode material and the impurity injection for forming the N type emitter layer 113 are carried out, when the gate electrode material is polycilicon, the surface thereof is oxidized in order to protect the surface of the gate electrode 104, and as shown in FIG. 30D, a protective insulating film 135 is formed on the surface of the gate electrode 104.

After forming the protective insulating film 135, as shown in FIG. 30E, the side wall films 131 are formed at the both side faces of the gate electrodes 104 and at the side walls in the slit portion 134 by depositing the insulating film such as an oxide films, a nitride film, or the like, and carrying out anisotropic etching. Note that, at this time, the gate insulating films 103 at the outer portion of the gate region are removed.

After forming the side wall films 131, as shown in FIG. 30F, the impurity injection for forming the P type base layer 105 is carried out on the surface layer portions of the N type semiconductor layers 102 at the both sides of the gate electrode 104.

In the semiconductor device according to the twelfth embodiment of the present invention, as illustrated, the slit portion 134 is formed at the gate electrode 104. Because the slit portion 134 is protected by the side wall film 131, it is not necessary to cover the slit portion 134 by forming a resist, and the process can be shortened by that much. Because protection by the resist is unnecessary, even when the gate electrode 104 is made to be minute, it is not necessary to consider matching offset of the resist for reliably protecting the slit portion 134. With respect to this point, the side wall film 131 is particularly effective.

When the impurity injection for forming the P type base layer 105 is carried out by ion implantation, due to the ion implantation being carried out with the angle of inclination from the vertical direction being made larger than that in the normal case, ion injection into the slit portion 134 is further suppressed, and the impurity can be deeply injected to the bottom portion of the sidewall film 131 at the both side faces of the gate electrodes 104, and a stable threshold voltage can be anticipated. The angle of inclination from the vertical direction of the ion implantation is usually 0° to 10°. However, here, the angle of inclination from the vertical direction of the ion implantation may be 30° to 45°.

After the impurity injection for forming the P type base layer 105, as shown in FIG. 30G, the P type base layer 105 is diffusion-formed. At this time, the N type emitter layer 113 is diffusion-formed at the same time.

After diffusion-forming the P type base layer 105 and the N type emitter layer 113, as shown in FIG. 30H, the region, other than the portion which will be the contact region with the source electrode 109 which will be formed later, is protected by being covered with the resist 136, and the impurity injection for forming the P type high concentration layer 112 is carried out. The impurity injection for forming the P type high concentration layer 112 is carried out such that the P type high concentration layer 112 has an impurity concentration higher than that of the P type base layer 105.

After removing the resist 136, as shown in FIG. 30I, the P type high concentration layer 112 is diffusion-formed at the surface layer portion of the P type base layer 105.

After diffusion-forming the P type high concentration layer 112, as shown in FIG. 30J, the portion which will be the contact region between the source electrode 109 and the P type high concentration layer 112, among the portion which will be the contact region with the source electrodes 109 which will be formed later, is protected by being covered with the resist 137, and the impurity injection for forming the N type source layer 106 is carried out. The region which is covered with the resist 138 is set such that the region where the source electrode 109 can be in contact with both of the P type high concentration layer 112 and the N type source layer 106 is ensured after diffusion-forming the N type source layer 106. Note that, when the P type high concentration layer 112 is not formed, the source electrode 109 is made to be in contact with the P type base layer 105.

As described above, because the slit portion 134 of the gate electrode 104 is protected by the side wall film 131, it is not necessary to cover the slit portion 134 with the resist 137. Even when the gate electrode 104 is made to be minute, it is not necessary to consider of matching offset of the resist 137 for reliably protecting the slit portion 134. With respect to this point, the side wall film 131 is particularly effective. Note that, when the gate electrode material forming the gate electrode 104 is polysilicon, the impurity injection is carried out on the gate electrode 104 at the time of the impurity injection for forming the N type source layer 106.

After removing the resist 138, as shown in FIG. 30K, the N type source layer 106 is diffusion-formed.

When the gate electrode material is polysilicon, after diffusion-forming the N type source layer 106, the polysilicon on the top face of the gate electrode 104 is exposed by etching. Thereafter, due to a metal such as titanium, tungsten, molybdenum, or the like being deposited, and being heat-treated at a temperature of 500 to 800° C., the polysilicon and the deposited metal layer are made to react with one another, and as shown in FIG. 30L, the silicide layer 133 is formed on the top face of the gate electrode 104. When the remaining metal which did not react is removed, the low-resistance gate electrode 104 having the silicide layer 133 at the top face thereof is formed. Note that, when the silicide layer 133 is not formed, the present process may be omitted.

After forming the silicide layer 133, as shown in FIG. 30M, the gate electrode 104 is covered with the interlayer insulating film 107, and a contact hole is formed to be open at the interlayer insulating film 107 at the contact region between the source electrode 109, and the P type high concentration layer 112 and the N type source layer 106. Thereafter, the source electrode 109 is formed.

Moreover, as shown in FIG. 30N, the drain electrode 110 is formed at the rear face of the N+ drain layer 101, and the semiconductor device according to the twelfth embodiment of the present invention shown in FIG. 22 is completed.

In accordance with the basic structure of the semiconductor device according to one embodiment of the present invention, the semiconductor device has the gate electrode which is formed on the semiconductor substrate via the gate insulating film and which has slit portions, the side wall films which are formed at the both side faces of the gate electrode and the side walls in the slit portions and which fill in the slit portions and cover the gate insulating film directly beneath the slit portions, and an interlayer insulating film which is formed to cover the gate electrode and the side wall films. Therefore, the gate capacity is reduced by an amount corresponding to the volume of the slit portion, and it is possible to attempt to make the switching speed to be fast.

In accordance with the method for manufacturing the semiconductor device according to one embodiment of the present invention, the gate electrode having slit portions are formed by processing a gate electrode material formed on a semiconductor substrate via a gate insulating film, and side wall films are formed at the both side faces of the gate electrode and the side walls in the slit portions by depositing an insulating film and carrying out anisotropic etching, and impurity injection for forming a source layer on the surface of the semiconductor substrate is carried out by using the gate electrode and the side wall films as a mask. Therefore, when the impurity injection for forming the source layer substrate is carried out, protection by forming a resist is unnecessary, and it is not necessary to consider matching offset in a case of forming a resist. Further, the gate capacity is reduced by an amount corresponding to the volume of the slit portion, and it is possible to attempt to make the switching speed of the semiconductor device to be fast.

In accordance with the semiconductor devices according to the other embodiments of the present invention, a ratio LG/LS of the gate electrode width LG to the interval LS between the gate electrodes is less than or equal to 1, and the gate electrode width LG is less than or equal to about 5 μm, and a ratio LG/xj of the gate electrode width LG to the vertical diffusion distance xj of the second conductive base layer satisfies the relationship of the inequality 1<LG/xj≦2.5. Therefore, while ensuring the withstand voltage of the MOSFET and suppressing the ON-resistance, it is possible to attempt to make the switching speed to be fast, and to realize low electric power consumption.

What is claimed is:

1. A semiconductor device comprising:
   a gate electrode which is formed on a semiconductor substrate via an insulating film, and which has a slit portion;
   side wall films which are formed at both side faces of the gate electrode and at side walls in said slit portion, and which fill an interior of said slit portion and cover the insulating film directly beneath said slit portion;
   an interlayer insulating film formed to cover the gate electrode and said side wall films;
   a plurality of said slit portions are formed at a plurality of places; and partial electrodes, other than two both end partial electrodes, among the respective
   partial electrodes of the gate electrode divided into three or more portions by the slit portions at the plurality of places are floating electrodes electrically separated from the both end partial electrodes and gate wiring.

2. A semiconductor device comprising:
   a first conductive type substrate layer structuring a drain layer;
   a first conductive type semiconductor layer formed on the substrate layer;
   second conductive type first and second base layers formed at a predetermined interval on a surface layer portion of the semiconductor layer;
   first conductive type first and second source layers respectively formed on surfaces of the first and second base layers;
   a gate insulating film formed on a substrate surface at a region extending from one side to another side of one end portions of the first and second source layers which are adjacent to one another;
   a gate electrode which is formed on the gate insulating film, and which has a slit portion;
   side wall films which are formed at both side faces of the gate electrode and at side walls in said slit portion, and which fill an interior of said slit portion and cover the gate insulating film directly beneath said slit portion;
   an interlayer insulating film formed to cover the gate electrode and said side wall films;
   a source electrode connected to the source layer and a base layer at a predetermined contact region;
   a drain electrode which is formed at a rear face side of the substrate layer, and which is connected to the substrate layer; and
   a first conductive type emitter layer which is formed at a surface layer portion of the semiconductor layer directly beneath said slit portion, and which has an impurity concentration which is higher than that of the semiconductor layer and lower than that of the base layer.

3. The semiconductor device according to claim 2 wherein the emitter layer is formed also at the surface layer portion of the semiconductor layer directly beneath both end portions of the gate electrode.

4. A semiconductor device comprising:
   a first conductive type substrate layer structuring a drain layer;
   a first conductive type semiconductor layer formed on the substrate layer;
   second conductive type first and second base layers formed at a predetermined interval on a surface layer portion of the semiconductor layer;
   first conductive type first and second source layers respectively formed on surfaces of the first and second base layers;
   a gate insulating film formed on a substrate surface at a region extending from one side to another side of one end portions of the first and second source layers which are adjacent to one another;
   a gate electrode which is formed on the gate insulating film, and which has a slit portion;

side wall films which are formed at both side faces of the gate electrode and at side walls in said slit portion, and which fill an interior of said slit portion and cover the gate insulating film directly beneath said slit portion;

an interlayer insulating film formed to cover the gate electrode and said side wall films;

a source electrode connected to the source layer and a base layer at a predetermined contact region;

a drain electrode which is formed at a rear face side of the substrate layer, and which is connected to the substrate layer;

a first conductive type emitter layer which is formed at a surface layer portion of the semiconductor layer directly beneath said slit portion of the gate electrode, and which has an impurity concentration which is higher than that of the semiconductor layer and lower than that of the base layer; and a plurality of said slit portions are formed at a plurality of places.

5. The semiconductor device according to claim 4 wherein the emitter layer is formed also at the surface layer portion of the semiconductor layer directly beneath both end portions of the gate electrode.

6. The semiconductor device according to claim 4 wherein said slit portions at two places among the slit portions at the plurality of places are respectively formed at the vicinities of a boundary between the base layer and the semiconductor layer, and the two emitter layers corresponding to said slit portions at the two places are respectively formed to partly overlap with one side and another side of the two base layers.

7. A semiconductor device comprising:

a first conductive type substrate layer structuring a drain layer;

a first conductive type semiconductor layer formed on the substrate layer;

second conductive type first and second base layers formed at a predetermined interval on a surface layer portion of the semiconductor layer;

first conductive type first and second source layers respectively formed on surfaces of the first and second base layers;

a gate insulating film formed on a substrate surface at a region extending from one side to another side of one end portions of the first and second source layers which are adjacent to one another;

a gate electrode which is formed on the gate insulating film, and which has a slit portion;

side wall films which are formed at both side faces of the gate electrode and at side walls in said slit portion, and which fill an interior of said slit portion and cover the gate insulating film directly beneath said slit portion;

an interlayer insulating film formed to cover the gate electrode and said side wall films;

a source electrode connected to the source layer and the base layer at a predetermined contact region;

a drain electrode which is formed at a rear face side of the substrate layer, and which is connected to the substrate layer;

a plurality of said slit portions are formed at a plurality of places; and partial electrodes, other than two both end partial electrodes, among the respective partial electrodes of the gate electrode divided into three or more portions by said slit portions at the plurality of places are floating electrodes electrically separated from the both end partial electrodes and gate wiring.

8. A semiconductor device comprising:

a first conductive type substrate layer structuring a drain layer;

a first conductive type semiconductor layer formed on the substrate layer;

second conductive type first and second base layers formed at a predetermined interval on a surface layer portion of the semiconductor layer;

first conductive type first and second source layers respectively formed on surfaces of the first and second base layers;

a gate insulating film formed on a substrate surface at a region extending from one side to another side of one end portions of the first and second source layers which are adjacent to one another;

a gate electrode which is formed on the gate insulating film, and which has a slit portion;

side wall films which are formed at both side faces of the gate electrode and at side walls in said slit portion, and which fill an interior of said slit portion and cover the gate insulating film directly beneath said slit portion;

an interlayer insulating film formed to cover the gate electrode and said side wall films;

a source electrode connected to the source layer and a base layer at a predetermined contact region; and a drain electrode which is formed at a rear face side of the substrate layer, and which is connected to the substrate layer;

a second conductive type high concentration layer which is formed at a surface layer portion of the base layer at a contact region with the source electrode, and which has an impurity concentration higher than that of the base layer.

9. A semiconductor device comprising:

a first conductive type substrate layer;

a first conductive type base layer formed on the first conductive type substrate layer;

a second conductive type base layer formed at predetermined intervals at a surface layer portion of the first conductive type base layer;

first conductive type source layers respectively formed at surface layer portions in vicinities of both ends of the second conductive type base layer;

gate insulating films respectively formed on a substrate surface at a region extending from one side to another side of one end portions of the two second conductive type base layers formed such that one end portions thereof are adjacent to one another;

gate electrodes respectively formed on the gate insulating films;

insulating films respectively formed to cover the gate electrodes;

a source electrode which is formed to cover a front face side of the substrate, and which is connected to the first conductive type source layer and the second conductive type base layer at a contact region between one of the gate electrodes and another of the gate electrodes;

a drain electrode which is formed at a rear face side of the first conductive type substrate layer, wherein a ratio $LG/LS$ of a gate electrode width $LG$ to an interval $LS$ between the gate electrodes is less than or equal to 1, the gate electrode width LG is less than or equal to about 5 μm, and a ratio LG/xj of the gate electrode width LG to a vertical diffusion distance xj of the second conductive type base layer satisfies a relationship of an inequality 1<LG/xj≦2.5; and a second conductive type high concentration layer which is formed at a surface layer portion at a central portion of the second conductive type base layer at the contact region, and which has an impurity concentration higher than that of the second conductive type base layer.

10. The semiconductor device according to claim 9, wherein the gate electrodes are made to be low-resistance by silicidation.

11. A semiconductor device comprising:

a first conductive type substrate layer;

a first conductive type base layer formed on the first conductive type substrate layer;

a second conductive type base layer formed at predetermined intervals at a surface layer portion of the first conductive type base layer;

first conductive type source layers respectively formed at surface layer portions in vicinities of both ends of the second conductive type base layer;

gate insulating films respectively formed on a substrate surface at a region extending from one side to another side of one end portions of the two second conductive type base layers formed such that one end portions thereof are adjacent to one another;

gate electrodes respectively formed on the gate insulating films;

insulating films respectively formed to cover the gate electrodes;

a source electrode which is formed to cover a front face side of the substrate, and which is connected to the first conductive type source layer and the second conductive type base layer at a contact region between one of the gate electrodes and another of the gate electrodes;

a drain electrode which is formed at a rear face side of the first conductive type substrate layer, wherein a ratio LG/LS of a gate electrode width LG to an interval LS between the gate electrodes is less than or equal to 1, the gate electrode width LG is less than or equal to about 5 μm, and a ratio LG/xj of the gate electrode width LG to a vertical diffusion distance xj of the second conductive type base layer satisfies a relationship of an inequality 1<LG/xj≦2.5; and a trench is formed at a portion including the first conductive type source layer and the second conductive type base layer.

12. The semiconductor device according to claim 11 wherein the gate electrodes are made to be low-resistance by silicidation.

13. A semiconductor device comprising:

a first conductive type substrate layer;

a first conductive type base layer formed on the first conductive type substrate layer;

a second conductive type base layer formed at predetermined intervals at a surface layer portion of the first conductive type base layer;

first conductive type source layers respectively formed at surface layer portions in vicinities of both ends of the second conductive type base layer;

gate insulating films respectively formed on a substrate surface at a region extending from one side to another side of one end portions of the two second conductive type base layers formed such that one end portions thereof are adjacent to one another;

gate electrodes respectively formed on the gate insulating films;

insulating films respectively formed to cover the gate electrodes;

a source electrode which is formed to cover a front face side of the substrate, and which is connected to the first conductive type source layer and the second conductive type base layer at a contact region between one of the gate electrodes and another of the gate electrodes;

a drain electrode which is formed at a rear face side of the first conductive type substrate layer, wherein a ratio LG/LS of a gate electrode width LG to an interval LS between the gate electrodes is less than or equal to 1, the gate electrode width LG is less than or equal to about 5 μm, and a ratio LG/xj of the gate electrode width LG to a vertical diffusion distance xj of the second conductive type base layer satisfies a relationship of an inequality 1<LG/xj≦2.5; and a first conductive type high concentration layer which is formed at a surface layer portion of the first conductive type base layer directly beneath the gate electrode, and which has an impurity concentration higher than that of the first conductive type base layer.

14. The semiconductor device according to claim 13 wherein the gate electrodes are made to be low-resistance by silicidation.

15. A semiconductor device comprising:

a first conductive type substrate layer;

a first conductive type base layer formed on the first conductive type substrate layer;

a second conductive type base layer formed at predetermined intervals at a surface layer portion of the first conductive type base layer;

first conductive type source layers respectively formed at surface layer portions in vicinities of both ends of the second conductive type base layer;

gate insulating films respectively formed on a substrate surface at a region extending from one side to another side of one end portions of the two second conductive type base layers formed such that one end portions thereof are adjacent to one another;

gate electrodes respectively formed on the gate insulating films;

insulating films respectively formed to cover the gate electrodes;

a source electrode which is formed to cover a front face side of the substrate, and which is connected to the first conductive type source layer and the second conductive type base layer at a contact region between one of the gate electrodes and another of the gate electrodes;

a drain electrode which is formed at a rear face side of the first conductive type substrate layer, wherein a ratio LG/LS of a gate electrode width LG to an interval LS between the gate electrodes is less than or equal to 1, the gate electrode width LG is less than or equal to about 5 μm, and a ratio LG/xj of the gate electrode width LG to a vertical diffusion distance xj of the second conductive type base layer satisfies a relationship of an inequality 1<LG/xj≦2.5.

wherein the gate electrodes are gate electrodes having slit portions;

side wall films which are formed at both side faces of the gate electrodes and at side walls in said slit portions, and which fill interiors of said slit portions and cover the gate insulating film directly beneath said slit portions;

an interlayer insulating film formed to cover the gate electrodes and said side wall films;

said slit portions are formed at a plurality of places; and partial electrodes, other than two both end partial electrodes, among the respective partial electrodes of the gate electrode divided into three or more portions by said slit portions at the plurality of places are floating electrodes electrically separated from the both end partial electrodes and gate wiring.

* * * * *